(12) United States Patent
Browning et al.

(10) Patent No.: US 11,429,158 B2
(45) Date of Patent: Aug. 30, 2022

(54) SENSOR ASSEMBLIES FOR ELECTRONIC DEVICES

(71) Applicant: Apple Inc., Cupertino, CA (US)

(72) Inventors: Lucy Elizabeth Browning, San Francisco, CA (US); Benjamin J. Pope, Mountain View, CA (US); Paul U. Leutheuser, Saratoga, CA (US); Scott A. Myers, Saratoga, CA (US); Richard Hung Minh Dinh, Saratoga, CA (US); Edward S. Huo, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/192,722

(22) Filed: Mar. 4, 2021

(65) Prior Publication Data

US 2021/0191458 A1    Jun. 24, 2021

Related U.S. Application Data

(63) Continuation of application No. 16/586,678, filed on Sep. 27, 2019, now Pat. No. 10,969,834, which is a
(Continued)

(51) Int. Cl.
*G06F 1/16*        (2006.01)
*H03K 17/96*    (2006.01)
(Continued)

(52) U.S. Cl.
CPC ............ *G06F 1/169* (2013.01); *G06F 1/1626* (2013.01); *G06F 1/1671* (2013.01);
(Continued)

(58) Field of Classification Search
None
See application file for complete search history.

(56) References Cited

U.S. PATENT DOCUMENTS 6,281,785 B1    8/2001  Hamaguchi
9,013,405 B2    4/2015  Kujawski et al.
(Continued)

FOREIGN PATENT DOCUMENTS

CN    102349035 A    2/2012
CN    104246791 A    12/2014
(Continued)

OTHER PUBLICATIONS

PCT Patent Application No. PCT/US2017/043446—International Search Report and Written Opinion dated Nov. 2, 2017.

*Primary Examiner* — Matthew Yeung
(74) *Attorney, Agent, or Firm* — Dorsey & Whitney LLP

(57) ABSTRACT

Sensor assemblies for electronic devices are described. According to some embodiments, the sensor assemblies include solid-state sensors, such as capacitive sensors, piezoelectric sensors or piezoresistive sensors. The sensor assemblies can include a number of features that provide a compact profile, making them well suited for integration into small spaces of electronic device enclosures. The sensor assemblies can also include features that isolate movement of various parts of the sensor assemblies, allowing for accurate detection of a sensing event. According to some embodiments, the sensor assemblies are coupled to haptic actuators, speaker, or both, which mimic the feel of a mechanical button and enhance a user's experience.

18 Claims, 19 Drawing Sheets

Related U.S. Application Data continuation of application No. 15/844,162, filed on Dec. 15, 2017, now Pat. No. 10,488,891, which is a continuation of application No. 15/449,810, filed on Mar. 3, 2017, now Pat. No. 9,870,033.

(60) Provisional application No. 62/424,300, filed on Nov. 18, 2016, provisional application No. 62/384,083, filed on Sep. 6, 2016, provisional application No. 62/381,525, filed on Aug. 30, 2016.

(51) Int. Cl.
    *H03K 17/975*      (2006.01)
    *G06V 40/13*      (2022.01)
    *G06F 3/01*      (2006.01)
    *G06F 3/16*      (2006.01)

(52) U.S. Cl.
    CPC .......... *G06F 1/1684* (2013.01); *G06F 1/1688* (2013.01); *G06F 3/016* (2013.01); *G06F 3/165* (2013.01); *G06V 40/1306* (2022.01); *H03K 17/962* (2013.01); *H03K 17/975* (2013.01); *G06F 3/167* (2013.01); *G06F 2203/0338* (2013.01); *H03K 17/964* (2013.01)

(56) References Cited

U.S. PATENT DOCUMENTS

| | | | |
|---|---|---|---|
| 9,053,617 | B2 | 6/2015 | Ramstein et al. |
| 2001/0026203 | A1 | 10/2001 | Van |
| 2006/0113178 | A1 | 6/2006 | Soma et al. |
| 2006/0119589 | A1 | 6/2006 | Rosenberg et al. |
| 2006/0197750 | A1 | 9/2006 | Kerr et al. |
| 2007/0273671 | A1 | 11/2007 | Zadesky et al. |
| 2008/0084384 | A1 | 4/2008 | Gregorio et al. |
| 2010/0148944 | A1 | 6/2010 | Kim et al. |
| 2010/0225600 | A1 | 9/2010 | Dai et al. |
| 2011/0102569 | A1 | 5/2011 | Erhart |
| 2011/0141052 | A1* | 6/2011 | Bernstein ................ G06F 3/041 345/174 |
| 2011/0273267 | A1 | 11/2011 | Bong |
| 2012/0118628 | A1 | 5/2012 | Pakula et al. |
| 2012/0250242 | A1 | 10/2012 | Graneto |
| 2012/0257341 | A1* | 10/2012 | Wang ................... H04M 1/0252 361/679.01 |
| 2013/0120265 | A1 | 5/2013 | Horii et al. |
| 2013/0207793 | A1 | 8/2013 | Weaber et al. |
| 2013/0231046 | A1 | 9/2013 | Pope et al. |
| 2013/0307818 | A1* | 11/2013 | Pope ................... G06K 9/00053 345/174 |
| 2014/0091857 | A1 | 4/2014 | Bernstein |
| 2014/0125471 | A1 | 5/2014 | Organ et al. |
| 2014/0139422 | A1* | 5/2014 | Mistry .................... G06F 1/163 345/156 |
| 2014/0262848 | A1 | 9/2014 | Fathollahi et al. |
| 2015/0049064 | A1 | 2/2015 | Shin |
| 2015/0061901 | A1* | 3/2015 | Casparian ............ H01H 13/705 341/22 |
| 2015/0071509 | A1 | 3/2015 | Myers |
| 2015/0153895 | A1 | 6/2015 | Hotelling |
| 2016/0005557 | A1 | 1/2016 | Mizutani et al. |
| 2016/0077622 | A1 | 3/2016 | Lee et al. |
| 2016/0179338 | A1 | 6/2016 | Miller |
| 2016/0306524 | A1 | 10/2016 | Park et al. |
| 2016/0328065 | A1 | 11/2016 | Johnson et al. |
| 2016/0364036 | A1 | 12/2016 | Deng et al. |
| 2016/0379776 | A1 | 12/2016 | Oakley |
| 2017/0032630 | A1 | 2/2017 | Gervais et al. |
| 2018/0042127 | A1 | 2/2018 | Kim et al. |
| 2020/0234027 | A1 | 7/2020 | Han et al. |

FOREIGN PATENT DOCUMENTS

| | | |
|---|---|---|
| CN | 105518706 A | 4/2016 |
| CN | 105718186 A | 6/2016 |
| JP | 2000347807 A | 12/2000 |
| JP | 2006-293463 A | 10/2006 |
| JP | 2006293463 A | 10/2006 |
| JP | 2010-244361 A | 10/2010 |
| JP | 2011028663 A | 2/2011 |
| JP | 2015-179577 A | 10/2015 |
| JP | 2016-009444 A | 1/2016 |
| KR | 20160054573 A | 5/2016 |
| WO | 2015088166 A1 | 6/2015 |
| WO | 2015192548 A1 | 12/2015 |
| WO | 2016016612 A1 | 2/2016 |

* cited by examiner

SENSOR ASSEMBLIES FOR ELECTRONIC DEVICES

CROSS-REFERENCE TO RELATED APPLICATIONS

The present application is a continuation of U.S. application Ser. No. 16/586,678, filed Sep. 27, 2019, entitled "SENSOR ASSEMBLIES FOR ELECTRONIC DEVICES," which is a continuation of U.S. application Ser. No. 15/844,162, filed Dec. 15, 2017, now U.S. Pat. No. 10,488,891 issued Nov. 26, 2019, which is a continuation of U.S. application Ser. No. 15/449,810, filed Mar. 3, 2017, entitled "SENSOR ASSEMBLIES FOR ELECTRONIC DEVICES," now U.S. Pat. No. 9,870,033 issued Jan. 16, 2018, which claims the benefit of U.S. Provisional Application No. 62/381,525, entitled "SENSOR ASSEMBLIES FOR ELECTRONIC DEVICES" filed on Aug. 30, 2016; U.S. Provisional Application No. 62/384,083, entitled "SENSOR ASSEMBLIES FOR ELECTRONIC DEVICES" filed on Sep. 6, 2016; and U.S. Provisional Application No. 62/424,300, entitled "SENSOR ASSEMBLIES FOR ELECTRONIC DEVICES" filed on Nov. 18, 2016, all of which are hereby incorporated by reference.

FIELD

The described embodiments relate to sensor assemblies suitable for consumer electronic devices. According to some embodiments, the sensor assemblies include solid-state sensors, such as capacitive touch sensors.

BACKGROUND

Conventional mechanical switches are used in numerous applications in electronic products. For example, many button and keyboard designs include mechanically based actuators that rely on relatively large movements to complete electrical circuits. Advantages of mechanical switches include their low cost and ability to provide audible and tactile response to a user. However, mechanical switches are relatively large in size and, therefore, are difficult to integrate into products that have very limited space. This can be a major obstacle for integrating into modern portable electronic products, which include a multitude of electronic components packed within small enclosures. Furthermore, mechanical switches can wear out quickly, and therefore may need frequent replacing. What are needed, therefore, are improved sensor and actuator designs for electronic devices.

SUMMARY

This paper describes various embodiments that relate to sensor assemblies for electronic devices. In particular embodiments, the sensor assemblies include solid-state sensors that require small deflections for activation and have small cross-section profiles.

According to a further embodiment, an electronic device is described. The electronic device includes a speaker and a haptic component. The electronic device also includes a display cover that covers a display of the electronic device. The display cover has an opening. The electronic device further includes a sensor assembly for accepting input for the electronic device. The sensor assembly includes a sensor cover positioned within the opening of the display cover and having an outer surface configured to accept the input. The sensor assembly also includes a sensor configured to detect the input. The sensor generates one or more signals that activate the haptic component and the speaker in response to the input.

According to one embodiment, a sensor assembly for detecting and responding to input is described. The sensor assembly includes a sensor cover having an exterior surface for accepting the input. The sensor assembly also includes a trim that encompasses a perimeter. The sensor assembly further includes a compliant member positioned between the sensor cover and a ledge of the trim. The compliant member is configured to compress and provide a return force in response to the input. The sensor assembly additionally includes a capacitive touch sensor configured to detect the input.

According to another embodiment, an electronic device is described. The electronic device includes a display cover that covers a display of the electronic device. The display cover has an opening defining an interior chamfered edge. The electronic device also includes a sensor assembly for accepting input for the electronic device. The sensor assembly includes a sensor cover positioned within the opening and having an outer surface configured to accept the input. The sensor assembly also includes a trim positioned within the opening between the sensor cover and the display cover. The trim has an exterior chamfered edge that engages with the interior chamfered edge of the display cover. The sensor assembly further includes a sensor configured to detect the input.

These and other embodiments will be described in detail below.

BRIEF DESCRIPTION OF THE DRAWINGS

The disclosure will be readily understood by the following detailed description in conjunction with the accompanying drawings, wherein like reference numerals designate like structural elements.

FIGS. 9A-9C show cross-section and top views of a trimless sensor assembly configuration, in accordance with some embodiments.

DETAILED DESCRIPTION

Figure 1A:
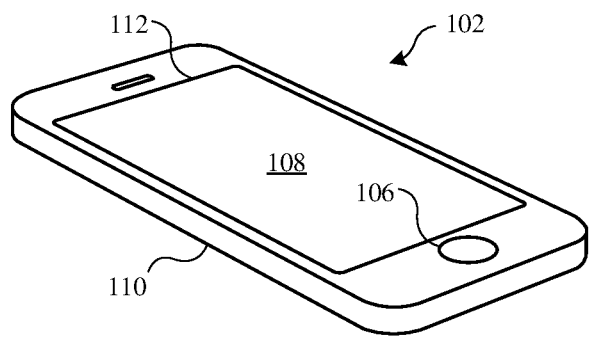
FIGS. 1A and 1B show perspective views of consumer electronic devices that can include sensor assemblies described herein.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Described herein are features of sensor assemblies that are well suited for consumer products, such as portable electronic devices. According to some embodiments, the sensor assemblies include solid-state sensors. Compared to conventional mechanical switches and buttons that depend on physical contact between contact pads, solid-state sensors utilize voltage or capacitive changes to switch between on and off modes. This aspect makes solid-state sensors less likely to wear out compared to mechanical switches. In addition, solid-state sensors are generally more compact than mechanical switches and buttons, making them well suited for integration within small form factor enclosures, such as those for portable electronic devices.

Furthermore, solid-state pressure sensor designs can require very small movements and forces in order to activate compared to mechanical switches and buttons. Since the sensor assemblies involve minimal or little movement (e.g., 10 micrometers or less, sometimes 5 micrometers or less), a user may not perceive movement of the sensor assembly (e.g., button) itself when pressed. Thus, the sensor assembly can be configured to provide tactile feedback (output) to the user in response to a user's touch input, which this gives the user the experience that the button has been depressed and activated, even if the sensor assembly barely moves. Examples of tactile feedback can include haptic (e.g., vibratory) feedback. In some instances, a signal to the user is in the form of acoustic or sonic feedback (i.e., makes a sound). In some cases, the sensor assembly is configured to provide a combination of tactile and acoustic feedback. These feedback features can mimic the experience of activating a mechanical switch or button, thereby providing a pleasing experience for a user. Furthermore, the sensor assembly can provide tactile feedback in response to a user's tactile input (e.g., user's touch), giving the user an engaging and satisfying sensation and experience with the electronic device.

The sensor assemblies described herein can include a number of features that enhance performance of the sensor assemblies when integrated within electronic devices. For example, a trim that surround a sensor cover or cap can prevent lateral movement of the sensor assembly and isolate movement of portions of the sensor assembly to a direction toward or away from a touch sensor.

The sensor assemblies described herein are well suited for integration into consumer products such as computers, portable phones, tablet devices, wearable electronic devices, and electronic device accessories, such as those manufactured by Apple Inc., based in Cupertino, Calif.

These and other embodiments are discussed below with reference to FIGS. 1A-13F. However, those skilled in the art will readily appreciate that the detailed description given herein with respect to these Figures is for explanatory purposes only and should not be construed as limiting.

Figure 1B:
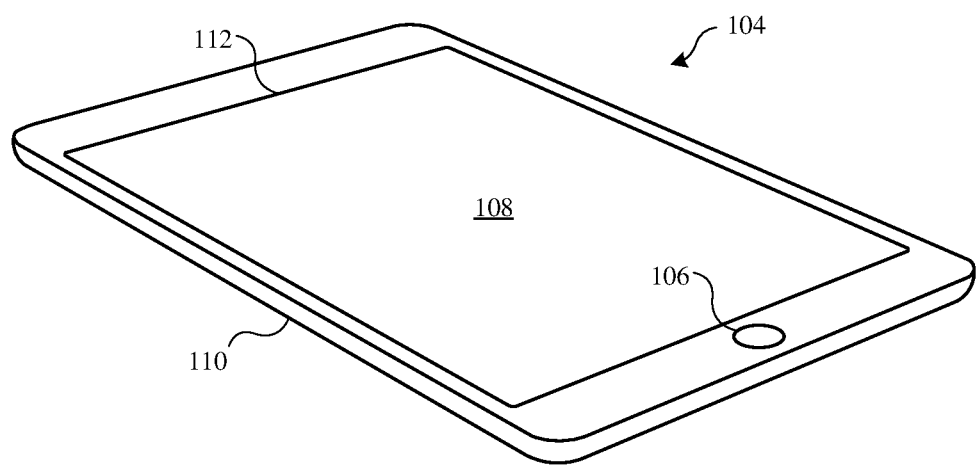

FIGS. 1A and 1B show consumer products than can include sensor assemblies such as those described herein. FIG. 1A shows portable phone 102, and FIG. 1B shows tablet computer 104, each of which includes sensor assemblies 106 configured to sense input from a user. Sensor assemblies 106 can be configured to activate one or more electrical circuits within respective devices 102 or 104, and therefore may be referred to as button assemblies or switch assemblies. For example, sensor assemblies 106 may be configured to activate aspects of displays 108 of devices 102 and 104, respectively. Sensor assemblies 106 can be designed to cosmetically enhance the appearance of enclosures 110 of devices 102 and 104. In some cases, sensor assemblies 106 are integrated with display covers 112 of enclosures 110.

Sensor assemblies 106 can include one or more sensors for detecting of input (e.g., touch, push, motion, light). In some cases, the sensors includes one or more capacitive, piezoelectric and piezoresistive sensors. In some cases, sensor assemblies 106 are configured to provide output to a user, such as haptic or acoustic feedback, to indicate that sensor assemblies 106 are activated in response to the input. In some embodiments, sensor assemblies 106 include fingerprint sensors that can detect and distinguish between fingerprints of different users. It should be noted that the sensor assemblies described herein can be integrated within any suitable electronic device and are not limited to devices 102 and 104 shown in FIGS. 1A and 1B. For example, the sensor assemblies can be implemented in laptop computers or wearable electronic devices.

Figure 2:
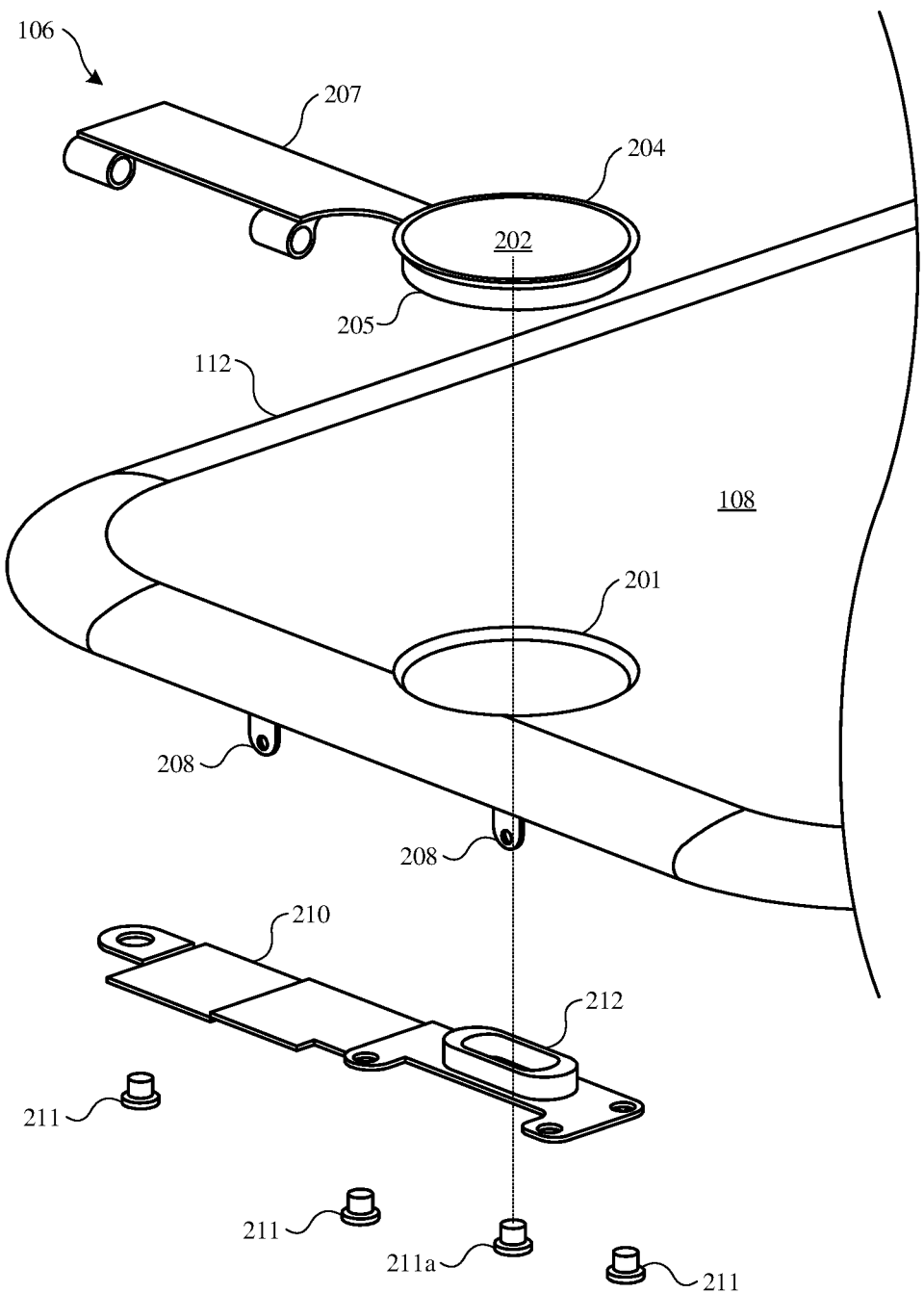
FIG. 2 shows an exploded view of a portion an electronic device with a sensor assembly in accordance with some embodiments.

FIG. 2 shows an exploded view of a portion of an electronic device (e.g., portable phone 102), showing how sensor assembly 106 is configured to fit within opening 201 of display cover 112. Display cover 112 can correspond to a transparent or partially transparent material that covers and protects an underlying display assembly. Display cover 112 can be composed of glass (e.g., sapphire), plastic, ceramic, and/or other suitable material. In some cases, display cover 112 is coupled with another portion of an enclosure for the portable phone (e.g., a metal portion of the enclosure) using fastening features 208. Bracket 210 can be used to secure sensor assembly 106 to display cover 112 via fasteners 211. It should be noted that the sensor assembly 106 can be inserted within an opening of any suitable portion of an electronic device and is not limited to integration with a display cover. For example, sensor assembly 106 can be inserted within an opening of a non-transparent enclosure wall of an electronic device.

As shown, sensor assembly 106 can in a pre-assembled in modular form for ease of assembly into an electronic device. Sensor assembly 106 includes sensor portion 205 and cable portion 207. Sensor portion 205 can include a sensor that is configured to detect input (e.g., touch, push, motion, light). In some cases the sensor is configured to detect touch or push input from a user's finger. In some instances the sensor includes one or more capacitive, piezoelectric and piezoresistive sensors. In some cases, sensor assembly 106 includes a fingerprint sensor configured to detect a users fingerprint. Cable portion 207 can include wiring that electrically connects sensor portion 205 to other electrical components within the electronic device. In some embodiments, cable portion 207 includes one or more flexible (flex) cables. Sensor cover 202 corresponds to a cosmetic cover having an exterior or outer surface configured to accept input. In some embodiments, sensor cover 202 is at least partially transparent such that an underlying fingerprint sensor can detect patterns of the user's fingerprint.

A perimeter of sensor cover 202 is encompassed by trim 204, which can correspond to a rigid ring or frame having an aperture to accommodate sensor cover 202. In some cases, an intermediate layer, such as an adhesive or polymer layer, is positioned between sensor cover 202 and display cover 112. In other cases, trim 204 is configured to directly engage with sensor cover 202 and display cover 112 so as to provide a tight fit. In some embodiments, trim 204 is composed of a metal material, which can provide sufficient rigidity without being too brittle. However, in some cases trim is composed of other rigid materials such as polymer or ceramic materials. As described in detail below, trim 204 can limit motion of the sensor assembly 106 once assembled within display cover 112. In addition, trim 116 is visible to a user, and therefore can enhance the appearance of sensor assembly 106. Due to its multiple functions, trim 116 can be referred to as a bracket, brace, support, washer, ring, band or other suitable term.

Sensor assembly 106 can be configured for easy assembly and disassembly. For example, sensor assembly 106 can be assembled from the top side of opening 201, and bracket 210 can be assembled from the bottom side of opening 201, as shown in FIG. 2. Bracket 210 can be composed of metal that is grounded to the enclosure of electronic device, and non-conductive portion 212 of bracket 210 electrically isolates the conductive portions of bracket 210 from sensor assembly 106. Since cable portion 207 should be positioned beneath display cover 112, cable portion 207 can be threaded through opening 201, then trim 204 and sensor cover 202 can be adjusted to fit snugly within opening 201. Fasteners 211 can then be used to secure bracket 210, which supports sensor assembly 106, to display cover 112. In the embodiment of FIG. 2, fasteners 211 are screws, but may alternatively or additionally include clips, press-fit fasteners, welds, or other suitable fasteners. In some cases, fastener 211a is aligned with a center of opening 201 and sensor cover 202.

It should be noted that the shape of sensor assembly 106 could vary depending on design requirements. In particular, sensor cover 202 and trim 204 are not limited to round or circular forms as shown. For example, sensor cover 202 and trim 204 can have rectangular, triangular, oval or any other suitable shapes.

Figure 3A:
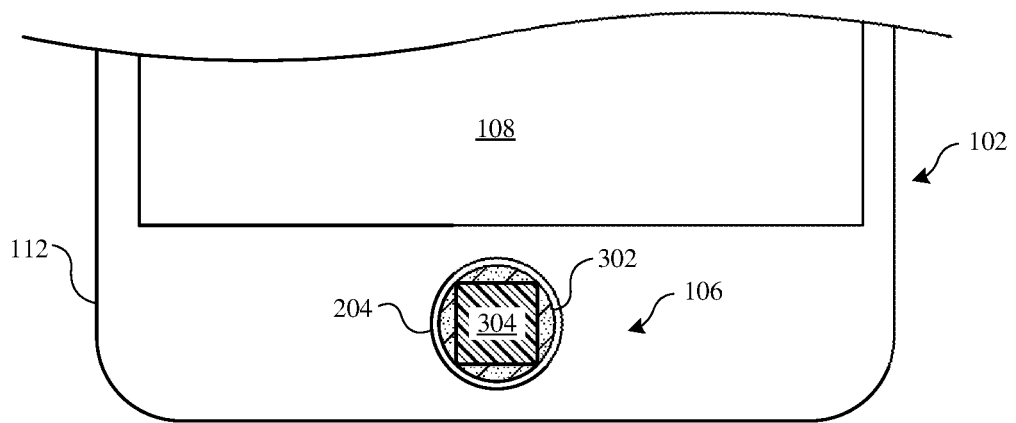
FIGS. 3A and 3B show top views of a sensor assembly portion of an electronic device of show in FIG. 1A.
Figure 3B:
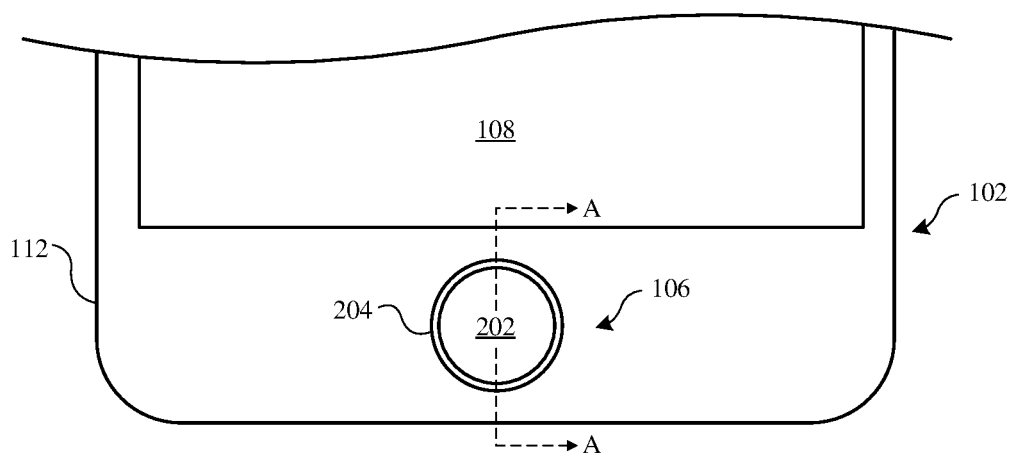

FIGS. 3A and 3B show top views of a portion of electronic device 102 having sensor assembly 106. FIG. 3B shows sensor assembly 106 with sensor cover 202, and FIG. 3A shows sensor assembly 106 without sensor cover 202. FIG. 3A shows that sensor component 304 is positioned beneath sensor cover 202. In some embodiments, sensor component 304 is a fingerprint sensor or touch sensor. Surrounding sensor component 304 is compliant member 302, which corresponds to one or more layers of compliant or resilient material, such a silicone or other polymer. In some cases, compliant member 302 includes separate pieces—in this case, four circle segment-shaped pieces to accommodate a rectangular-shaped sensor component 304.

It should be noted, however, that compliant member 302 can have any suitable shape and include any suitable number of pieces. FIG. 3B shows sensor assembly 106 fully assembled within electronic device 102. As shown, sensor cover 202 is surrounded by trim 204, both of which are exposed to a user of electronic device 102. Sensor cover 202 also provides a contact surface for a user to contact and activate sensor assembly 106.

Figure 4A:
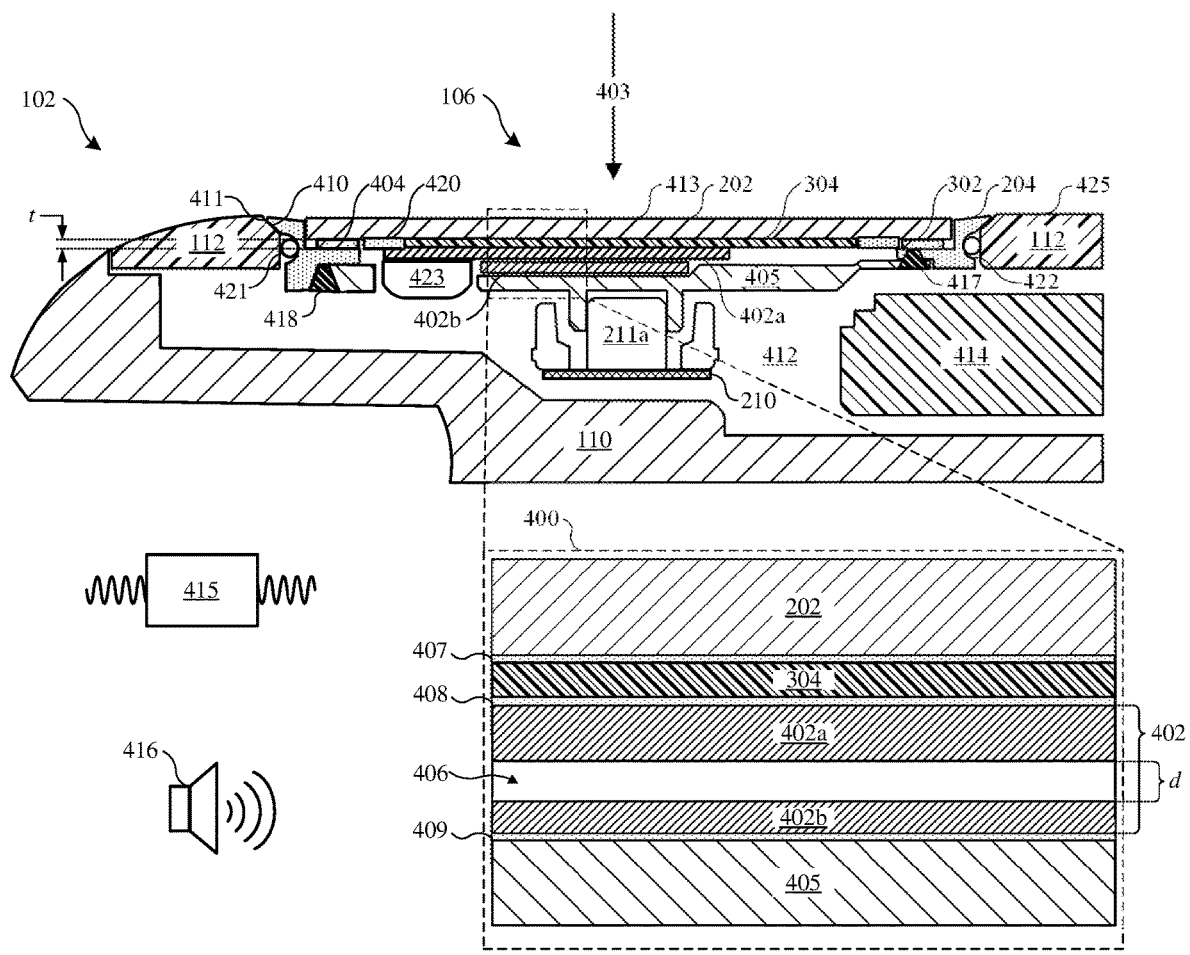
FIG. 4A shows a cross-section view of the sensor assembly portion of the electronic device shown in FIG. 3B.

FIG. 4A shows a cross-section view (A-A in FIG. 3B) of a portion of electronic device 102, showing how sensor assembly 106 can be assembled within electronic device 102, in accordance with some embodiments. Trim 204 is positioned between sensor cover 202 and display cover 112, which is, in turn, coupled to enclosure portion 110. As shown, sensor assembly 106 has a very thin cross-section, thereby making room for components such as component 414. In one particular embodiment, component 414 is a driver as part of a display assembly. Trim 204 includes ledge 404, which supports the backside of sensor cover 202. Compliant member 302, which has a thickness t, is positioned between sensor cover 202 and ledge 404 of trim 204. Compliant member 302 can be adhered to sensor cover 202 and ledge 404 by adhesive layers (not shown), such as layers of heat activated film, pressure sensitive adhesive, liquid adhesive, or other suitable adhesive material. In some embodiments, compliant member 302 includes holes or channels that accommodate overflow of the adhesive.

Inset 400 shows a detail cross-section view of a stack up of sensor assembly 106. Beneath sensor cover 202 is fingerprint sensor 304, which is configured to scan a fingerprint of a user through sensor cover 202. In some cases, fingerprint sensor 304 is a silicon chip having an array of capacitors and that is in communication with software that can capture a user's fingerprint image and match it with stored fingerprint data. Fingerprint sensor 304 can be coupled to sensor cover 202 by adhesive 407, which can be an optically transparent adhesive or other suitable adhesive.

Beneath fingerprint sensor 304 is touch sensor 402, which in the embodiment of FIG. 4A is a capacitive touch sensor that includes first layer 402a and second layer 402b. Capacitor module 423 is associated with touch sensor 402. In some embodiments, first layer 402a and second layer 402b each correspond to flat flexible materials that include a layer of conductive material (e.g., copper) or other suitable material (e.g., indium tin oxide (ITO)) that are capacitively coupled with respect to one another. First layer 402a is physically coupled to fingerprint sensor 304 by first adhesive layer 408, and second layer 402b is physically coupled to stiffener 405 by second adhesive layer 409—which can be different or the same types of adhesives. First layer 402a and second layer 402b are spaced apart by gap 406 having a distance d such that a change in distance d is detected by a voltage or capacitive change. Distance d can vary depending on design and manufacture of touch sensor 402. Gap 406 can be filled with air or other a non-conductive material, such as a compliant gel. In some embodiments, air is found to provide better sensing capability than a gel.

When a user touches exterior surface 413 of sensor cover 202, the force is transferred to first layer 402a in a direction 403 toward sensor 402 (referred to as a sensing direction) and into a pressed position. This, in turn, causes a corresponding reduction in distance d between capacitive layers 402a and 402b, thereby causing a change in voltage or capacitance in touch sensor 402. Touch sensor 402 then generates a signal that activates one or more electrical circuits of electronic device 102. Compliant member 302 is composed of a compliant material that provides a resistive force (opposite sensing direction 403) that returns sensor cover 202, and therefore also first layer 402a, back to its un-pressed position. Once sensor cover 202 is back in its un-pressed position, compliant member 302 returns to its full thickness t. Since there is very little space for compliant member 302, thickness t should be very thin. In some cases, thickness is no more than about 500 micrometers—in some cases, ranging from about 50-100 micrometers.

The change in distance d sufficient to cause activation of touch sensor 402 will depend on the design of touch sensor 402. In general, the required change in distance d will be very small. In some cases, the change in distance d is about 2-3 micrometers (corresponding to a compliance of about 5-10 nm/gram-force for touch sensor 402). Ledge 404 of trim 204 acts as a hard stop that prevents the amount of movement of sensor cover 202 in sensing direction 403. In particular, ledge prevents first layer 402a from contacting second layer 402b, or otherwise allowing first layer 402a to come too close to second layer 402b. In some cases, deflection in the material of sensor cover 202 when pressed by a user can also contribute to changes in distance d. However, this aspect can be factored into the design of sensor assembly 106. In some embodiments, sensor cover 202 is composed of a rigid material, such as glass (e.g., sapphire), ceramic or rigid polymer, so as to reduce material deflection effects of sensor cover 202. In some embodiments, sensor cover 202 moves from the un-pressed position to the pressed position by a distance of less than about 50 micrometers sensing direction 403. In some cases, sensor cover 202 moves from the un-pressed position to the pressed position by a distance of less than about 10 micrometers. In a particular embodiment, sensor cover 202 moves from the un-pressed position to the pressed position by a distance of about 4 micrometers.

Note that the embodiments described herein are not limited to capacitive sensors. For example, instead of, or in addition to, a capacitive touch sensor 402, sensor assembly 106 can include a piezoelectric or piezoresistive sensor. That is, any suitable solid-state sensors may be used.

Compared to conventional mechanical switches and buttons, sensor assembly 106 requires very little physical movement with the assembly itself for activation. This allows for sensor assembly 106 to have a much more compact cross-section (z-stack) compared to mechanical switches and buttons, thereby providing more room for other components within electronic device 102, such as component 414. Furthermore, sensor assembly 106 may not depend on mechanical contact within touch sensor 402. Instead, sensor 402 can utilize small voltage or capacitance changes brought about by a relatively small force input, which may be accomplished using a solid-state sensor. In general, solid-state sensors, such as capacitive touch, piezoelectric and piezoresistive sensors, can include electrical circuits built within solid material, such as semiconductor materials. The relatively non-mechanical aspect of solid-state sensors can make sensor assembly 106 less likely to wear out compared to conventional mechanical switches and buttons. Moreover, since sensor assembly 106 may require a small force for activation compared to mechanical switches and buttons, this can provide an easier input means for electronic device 102 and a better user experience. Furthermore, since the solid-state sensor can require less movement in the sensing direction 403 compared to mechanical switches, the cross-section of sensor assembly 106 can be smaller (thinner) than that of a mechanical switch assembly.

Other design considerations include features that isolate movement of sensor cover 202 when transitioning between the pressed and un-pressed positions. For example, tight engagement of trim 204 with display cover 112 and sensor cover 202 prevents lateral movement of sensor assembly 106 with respect to sensing direction 403. Thus, trim 204 should have a size and shape in accordance with the size and shape of each of sensor cover 202 and the opening of display cover 112. Furthermore, stiffener 405 provides rigid support for second layer 402b of touch sensor 402. Stiffener 405 is coupled to trim 204 via fastening members 418, which in some embodiments are weld spots. This is because in some cases welding is found to provide the strongest bond and provide the most reliable rigidity within the limited space provided for sensor assembly 106. The combination of the above structural features and bracket 210 prevents sensor assembly 106 from encroaching into internal cavity 412 and making contact with component 414 during drop events and other large force events.

In the embodiment of FIG. 4A, trim 204 has a chamfered edge 410 that corresponds to a chamfered edge 411 of display cover 112. This chamfered design creates a hard stop such that sensor assembly 106 is not able to intrude within internal cavity 412 of enclosure 110. In particular, although bracket 210 and fastener 211a support and secure sensor assembly 106 to display cover 112, the matching chamfered geometries of trim 204 and display cover 112 further prevent shifting of sensor assembly 106 and encroachment of sensor assembly 106 into internal cavity 412. These chamfered geometries can have an advantage over a stepped geometry for manufacturing purposes. In particular, a stepped geometry is more difficult to polish than a chamfered geometry. Furthermore, the angled geometry allows for more flexibility with regard to stack up tolerance compared to stepped geometry. In some embodiments, chamfered edges 410 and 411 are each chamfered by about 45 degrees with respect to outer surface 425 of display cover 112. In some embodiments, sensor assembly 106 is installed such that exterior surface 413 of sensor cover 202 is slightly recessed with respect to outer surface 425 of display cover 112 (in some cases, recessed by about 100 micrometers). This recessed configuration of sensor cover 202 can help prevent inadvertent activation (i.e., false triggers) of sensor assembly 106.

In some embodiments, sensor assembly 106 is configured to provide feedback to a user. For example, sensor assembly 106 can be electrically coupled to haptic actuator 415 (which can be referred to as a haptic component) that causes electronic device 102 to vibrate. This type of haptic feedback is sometimes referred to as taptic feedback, and haptic actuator 415 can be referred to as a taptic engine. Additionally or alternatively, sensor assembly 106 can be electrically coupled to speaker 416 that provides acoustic feedback to the user. In some cases, the combination of both haptic feedback and acoustic feedback creates an experience for a user that mimics depression of a mechanical button or switch. In one embodiment, sensor assembly 106 causes speaker 416 to produce a very quiet, high pitch and crisp sound that mimics the sound of mechanical button being pressed, and causes haptic actuator 415 to produce a very brief vibration that mimics the feel of a mechanical button being pressed. In some cases, haptic actuator 415 is able to vibrate and also produce a sound without the addition of sound from speaker 416.

Haptic actuator 415 and speaker 416 can be located in any suitable part of electronic device 102. For example, haptic actuator 415 can positioned at a distal side (not shown) of electronic device 102 with respect to sensor assembly 106, and can be activated by other electronic components of electronic device 102. Likewise, speaker 416 can be positioned on a sidewall (not shown) of electronic device 102, and can be used to provide other sounds (e.g., ring tones and alerts) to a user. That is, sensor assembly 106 can activate haptic actuator 415 and/or speaker 416, which are already components of electronic device 102 for other purposes. In other embodiments, haptic actuator 415 and/or speaker 416 are dedicated feedback components for sensor assembly 106. In these designs, it may be beneficial to position haptic actuator 415 and/or speaker 416 adjacent to sensor assembly 106.

In some embodiments, one or more sealing features provide a moisture barrier from the external environment. For example, seal 420 positioned around an internal perimeter of trim 204 adjacent to compliant member 302 can prevent moisture from the external environment from entering between sensor cover 202 and trim 204 and contacting fingerprint sensor 304 or touch sensor 402, or from entering internal cavity 412. Since seal 420 is positioned adjacent to compliant member 302, the material of seal 420 should be compliant enough to prevent interference with the compressing and decompressing of compliant member 302. In some cases, seal 420 is composed of a very compliant polymer adhesive, such as a silicone-based adhesive.

Seal 421 can prevent moisture from entering internal cavity 412 between trim 204 and display cover 112. In some cases, seal 421 is in the form of an O-ring that is positioned within groove 422 at an outer perimeter of trim 204. If seal 421 is an O-ring, the diameter of the O-ring may need to be smaller than conventionally manufactured since space is so limited in and around sensor assembly 106. In a particular embodiment, the diameter of the O-ring seal 421 is less than about 0.5 millimeters.

Figure 4B:
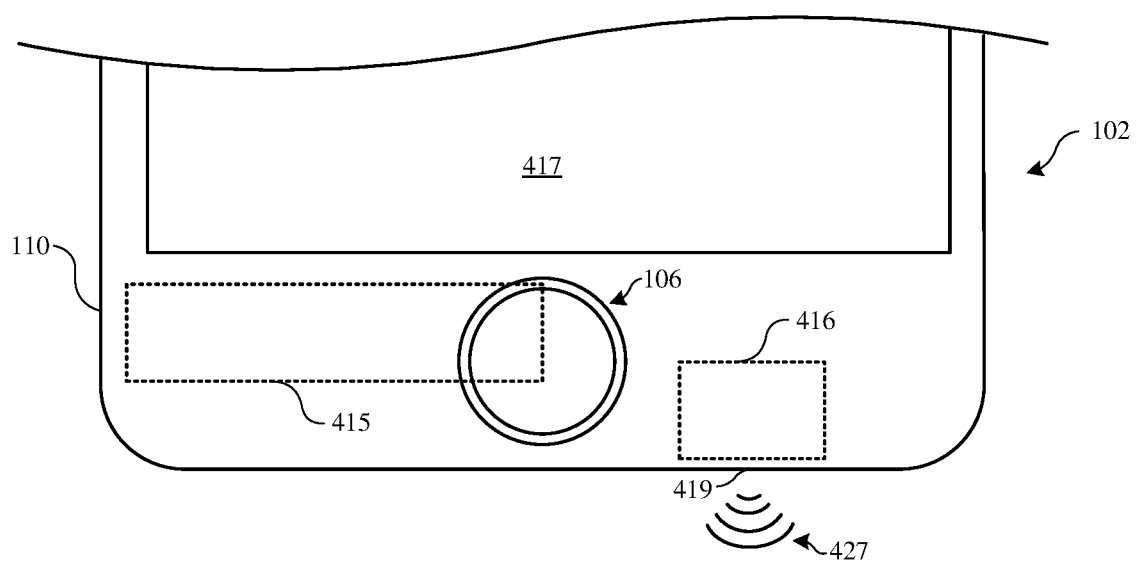
FIG. 4B shows a top view of an electronic device having a sensor assembly, a haptic engine and a speaker.

FIG. 4B shows a top view of a portion of device 102 indicating location of sensor assembly 106 in relation to haptic actuator 415 and speaker 416, in accordance with some embodiments. As shown, haptic actuator 415 and speaker 416 can be separate electronic components housed within enclosure 110. In some cases, haptic actuator 415 and speaker 416 are positioned proximate to and partially under sensor assembly 106. In some instances, haptic actuator 415 and speaker 416 each serve functions other than solely dictated by sensor assembly 106. For example, haptic actuator 415 can provide tactile feedback to a user (e.g. by vibrating enclosure 110) in response to other types of input from a user, such as touch input from the user contacting display 417, or any other suitable signal as dictated by device 102 (e.g. phone call, text messages, alarm, etc.). In some cases haptic actuator 415 makes a sound when vibrating, thereby also providing acoustic feedback to a user. Speaker 416 can be arranged to produce sound that is directed through one or more openings 419 within enclosure 110. Speaker 416 can produce sound 427 in response any suitable signal as dictated by device 102 (e.g. user input, phone call, text messages, alarm, etc.). Thus, haptic actuator 415 and speaker 416 can each have multiple uses and are not solely dedicated to the service of sensor assembly 106. In some embodiments, however, haptic actuator 415 and speaker 416 are fully dedicated to the responding to signals from sensor assembly 106.

It should be noted that the locations of haptic actuator 415 and speaker 416 of device 102 can vary depending on design needs and are not limited to the locations depicted in FIG. 4B. In some designs it may be beneficial to have haptic actuator 415 and speaker 416 positioned proximate to sensor assembly 106 so that the user can more readily associate vibrations of haptic actuator 415 and noises of speaker 416 with pressing of sensor assembly 106. However, in some cases, it may be beneficial to have haptic actuator 415 and speaker 416 positioned in different locations within device 102. For example, in some designs one or both haptic actuator 415 and speaker 416 can be located at an opposing side of device 102 than the location of sensor assembly 106. Furthermore, the number of haptic actuators 415 and speakers 416 can vary, depending on desired user experience and design requirements.

Figure 5:
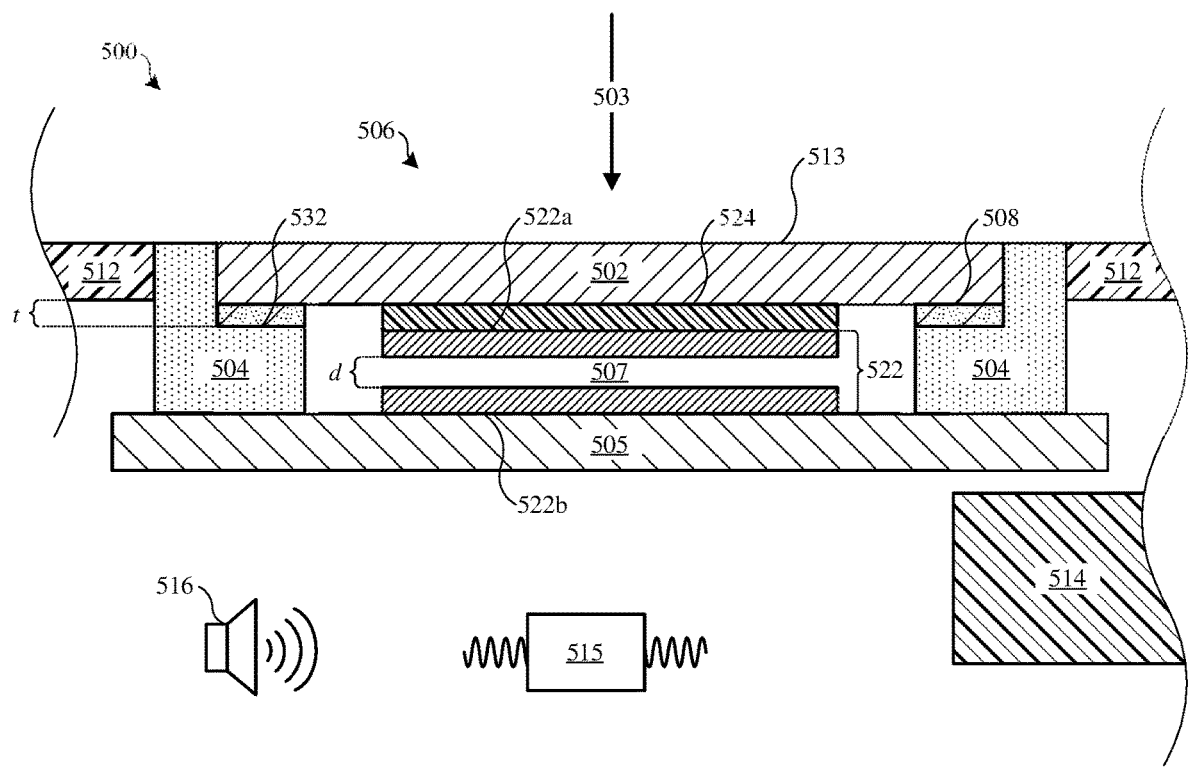
FIG. 5 shows a cross-section view of a sensor assembly portion of an electronic device in accordance with some embodiments.

FIG. 5 shows a cross-section view of a portion of electronic device 500, which includes sensor assembly 506, in accordance with some embodiments. Sensor assembly 506 is assembled within an opening of enclosure portion 512. In some embodiments, enclosure portion 512 corresponds to a display cover that covers a display assembly of electronic device 500. Sensor assembly 506 includes fingerprint sensor 524 and touch sensor 522. Fingerprint sensor 524 is configured to recognize fingerprint features of a user through sensor cover 502. Touch sensor 522 is configured to detect input, such as from a user's finger touching exterior surface 513 of sensor cover 502. Touch sensor 522 can be any suitable solid-state sensor capable of detecting a touch input. In some embodiments, touch sensor 522 includes one or more of a capacitive sensor, piezoelectric sensor and piezoresistive sensor. The small cross-section of sensor assembly 506 allows for more room within enclosure 512 for other components, such as electronic component 514.

Trim 504 encompasses a perimeter of sensor cover 502 and isolates movement of the sensor cover 502 between a pressed position and an un-pressed position. In particular, trim 504 prevents lateral movement of sensor cover 502 so as to limit movement of sensor cover 502 to sensing direction 503 (toward touch sensor 522) and a direction opposite sensing direction 503 (away from touch sensor 522). Compliant member 508 is positioned between sensor cover 502 and ledge 532 of trim 504. Compliant member 508 can be in the form of a single piece or multiple pieces (e.g., see compliant member 302 in FIG. 3A). When a user applies a force on exterior surface 513 of sensor cover 502, thickness t of compliant member 508 compresses accordingly. Compliant member 508 is configured to provide a return force that returns sensor cover 502 back to the un-pressed position from the pressed position.

Sensor cover 502 is coupled to first layer 522a of touch sensor 522, and stiffener 505 is coupled to second layer 522a of touch sensor 522. Stiffener 505 is rigidly coupled to enclosure portion 512 via trim 504, thereby keeping second layer 522b stationary with respect to enclosure portion 512. Thus, when sensor cover 502 moves in sensing direction 503 to a pressed position in response to a force, distance d of gap 507 between first layer 522a and second layer 522a is reduced, thereby causing a voltage or capacitance shift within touch sensor 522. In some cases, this voltage or capacitance change causes touch sensor 522 to generate a signal that activates one or more components. When compliant member 508 returns sensor cover 502 to the un-pressed position, gap 507 returns to its original distance d, thereby returning the voltage or capacitance to the original voltage. In some cases, the voltage or capacitance change causes touch sensor 522 to generate a signal that deactivates the one or more components, and/or that activates one or more other components.

In some embodiments, sensor assembly 506 is electrically coupled to haptic actuator 515 and/or speaker 516. This configuration allows a touch event from a user to be associated with haptic and/or acoustic feedback to the user. For example, sensor assembly 106 can cause speaker 516 to produce a clicking sound, and/or cause haptic actuator 515 to produce a very brief vibration that simulates pushing of a mechanical switch. Haptic actuator 515 and speaker 516 can be part of sensor assembly 506 itself, or be situated in a different region of electronic device 500.

Figure 6:
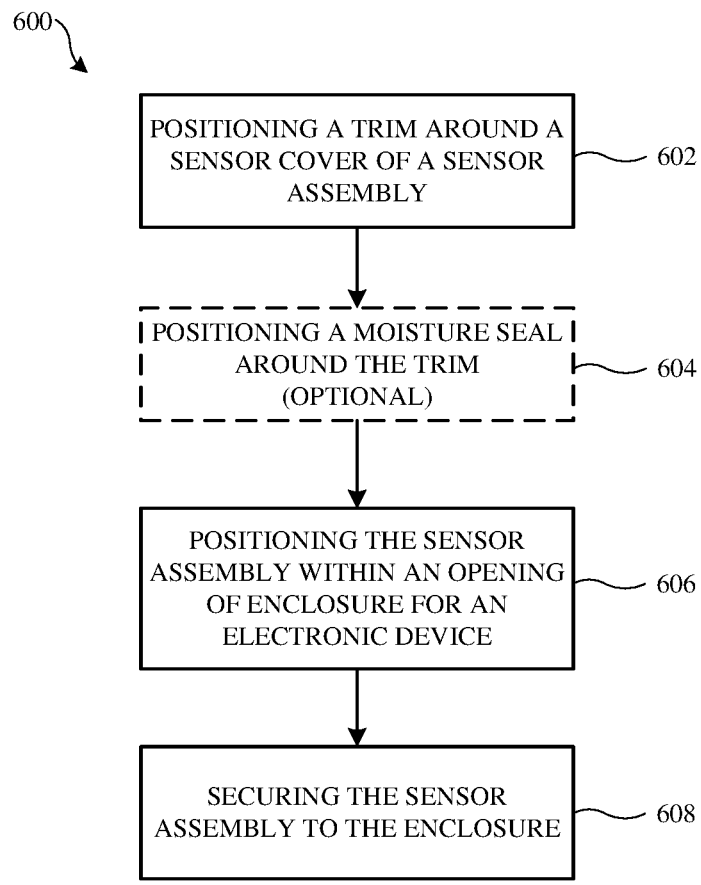
FIG. 6 shows a flowchart indicating a process for assembling a sensor assembly within an electronic device in accordance with some embodiments.

FIG. 6 shows a flowchart indicating a process for assembling a sensor assembly within an electronic device. At 602, a trim is positioned around a perimeter of a sensor cover of a sensor assembly. The sensor cover can have a round, rectangular, triangular, oval or other suitable shape, with the trim having a correspondingly shaped aperture. At 604, one or more moisture seals positioned around the trim. In one embodiment, moisture seal has an O-ring shape and is positioned within a groove at an outer perimeter of the trim. The moisture seal can be composed of a compliant material, such as silicon or other polymer material.

At 606, the sensor assembly is positioned within an opening of an enclosure for an electronic device. The sensor assembly can be assembled within a wall of the enclosure, such as a transparent, glass display cover for the electronic device, or an opaque metal or plastic wall of the enclosure. The opening should have a shape corresponding to that of the outer perimeter of the trim such that a tight fit between the two is achieved. In some cases, the sensor assembly is assembled from a top side of the opening while a bracket is assembled from a bottom side of the opening 201. In some cases, this involves bending and threading a cable portion of the sensor assembly within the opening before adjusting the trim and the sensor cover snugly within opening. In some cases, a top surface of the sensor cover is recessed with respect to a top surface of the enclosure.

At 608, the sensor assembly is secured to the enclosure. In some embodiments, the bracket supports a bottom portion of the sensor assembly with respect to the enclosure. Fasteners, such as screws or welds, can be used to secure the bracket and the sensor assembly to the enclosure. In some cases, the fasteners are tightened in a manner such that chamfered interfaces between the trim and enclosure tightly engage with one another.

Figure 7A:
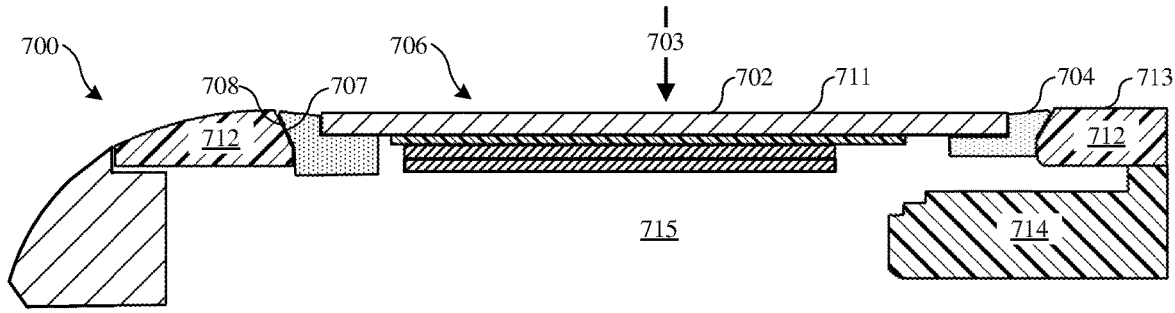
FIGS. 7A-7C show cross-section views of sensor assembly mounting configurations, in accordance with some embodiments.
Figure 7B:
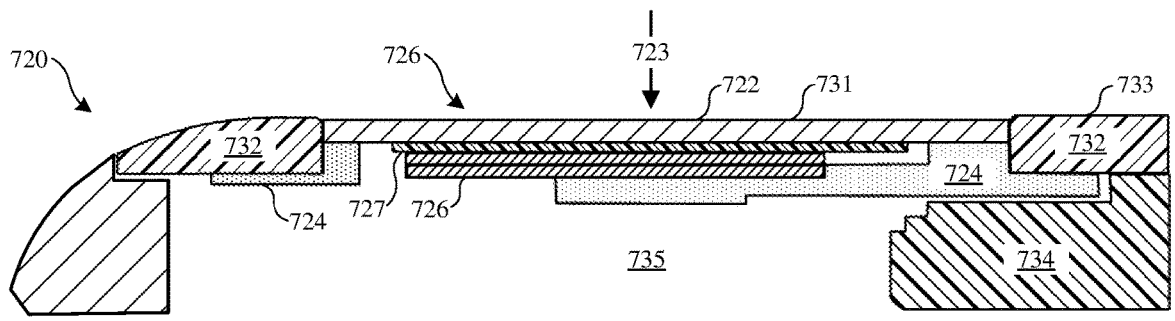
Figure 7C:
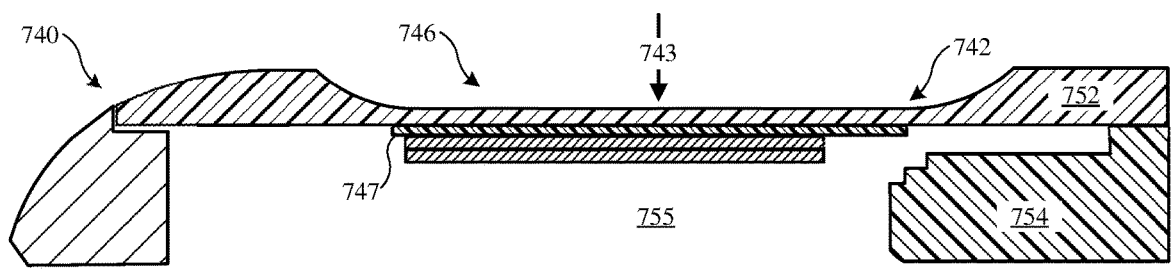

FIGS. 7A-7C show cross-section views of sensor assembly mounting configurations, in accordance with some embodiments. FIG. 7A shows sensor assembly 706, which is assembled within electronic device 700. Sensor assembly 706 includes sensor cover 702 having a perimeter that is encompassed by trim 704. Trim 704 is positioned between and engages both sensor cover 702 and enclosure portion 712. In some embodiments, enclosure portion 712 corresponds to a display cover that covers a display assembly of electronic device 700. As show, trim 704 has a chamfered edge 707, which engages with corresponding chamfered edge 708 of enclosure portion 712. In some cases, the geometries of chamfered edges 707 and 708 are chosen such that exterior surface 711 of sensor cover 702 is recessed with respect to exterior surface 713 of enclosure portion 712. The chamfered edge mounting configuration shown in FIG. 7A is similar to that of FIG. 4A, described above.

One of the advantages of the mounting configuration of FIG. 7A is chamfered edge 707 of trim 704 can secure sensor cover 702 around its full perimeter, thereby preventing a user from being able to push sensor assembly 706 into internal cavity 715 or putting pressure onto electronic component 714. This can be of particular importance if electronic component 714 includes relatively fragile components, such as a silicon chip. In some embodiments, electronic component 714 includes a driver as part of a display assembly. Furthermore, chamfered edges 707 and 708 secures sensor assembly 706 so well that sensor assembly 706 does not encroach within cavity 715 or put significant pressure on electronic component 714 even when electronic device 700 experiences a drop event or other high impact events. Another advantage of the mounting configuration of FIG. 7A is that chamfered edges 707 and 708 can localize the pressure from a user's finger in a sensing direction 703.

FIG. 7B shows sensor assembly 726 is assembled within electronic device 720. Instead of a trim, sensor assembly 726 is supported by back plate 724. Back plate 724 is coupled to both sensor cover 722 and enclosure portion 732, and is positioned below sensors 726 and 727. In some embodiments, sensor 726 corresponds to a portion of a touch sensor and sensor 727 corresponds to a portion of a fingerprint sensor. Back plate 724 can be coupled to enclosure portion 732 and/or sensor cover 722 by an adhesive or by engagement from an insert molding process. For example, back plate 724 can be composed of a plastic material that is molded onto enclosure portion 732. In some embodiments, exterior surface 731 of sensor cover 722 is recessed with respect to exterior surface 733 of enclosure portion 732.

One of the advantages of the mounting configuration of FIG. 7B is that back plate 724 can be not visible to a user, which may provide a cosmetic advantage in some applications. Furthermore, this configuration can localize the pressure from a user's finger to a sensing direction 723. Moreover, because of its position, back plate 724 can provide strong support for sensor assembly 726 such that sensor assembly 726 does not encroach in internal cavity 735 or contact electronic component 734. However, this configuration may provide less support at the top of sensor assembly 726 than those embodiments that include a trim. This factor may not be important, however, depending on the particular application and other design considerations of electronic device 720.

FIG. 7C shows sensor assembly 746 is assembled within electronic device 720. In this embodiment, enclosure portion 752 corresponds to a display cover that covers a display assembly of electronic device 740. In a particular embodiment, at least part of enclosure portion 752 is at least partially transparent such that the underlying display is viewable through enclosure portion 752. Instead of a separate sensor cover, enclosure portion 752 covers sensor assembly 746. That is, part of enclosure portion 752 acts as a sensor cover. In some embodiments, the portion covering sensor assembly 746 is locally thinned so as to provide a recess 742 within enclosure portion 752. Recess 742 may be detectable by a user when the user touches enclosure portion 752 (and in some cases visually detectable by a user) and act as a guide so that the user can locate sensor assembly 746. In other embodiments, recess 742 is located within an interior surface of enclosure portion 752 (i.e., backside of enclosure portion 752 adjacent to sensor 747.

One of the advantages of the mounting configuration of FIG. 7C is that enclosure portion 752 provides a continuous surface that covers the display and sensor assembly 746 of electronic device 740. This can provide good protection to sensor assembly 746 from liquids or other agents without the use of seals. Furthermore, the continuous surface of enclosure portion 752 may be cosmetically appealing in some applications. However, this configuration may limit the movement of sensor assembly 746 in sensing direction 743. In particular, since enclosure portion 752 cover sensor assembly 746, movement of sensor assembly 746 in sensing direction 743 depends on deflection of the material of enclosure portion 752, which can limit the amount of movement in sensing direction 743. Depending on the material of enclosure portion 752, this can make it more difficult for a user to depress sensor assembly 746 sufficiently for actuation. Furthermore, if the material of enclosure portion 752 is sufficiently flexible, a user's touch input may cause sensor assembly 746 to encroach into internal cavity 755 or touch electronic component 754. These factors may not be important, however, depending on the particular application and other design considerations of electronic device 740.

Figure 8A:
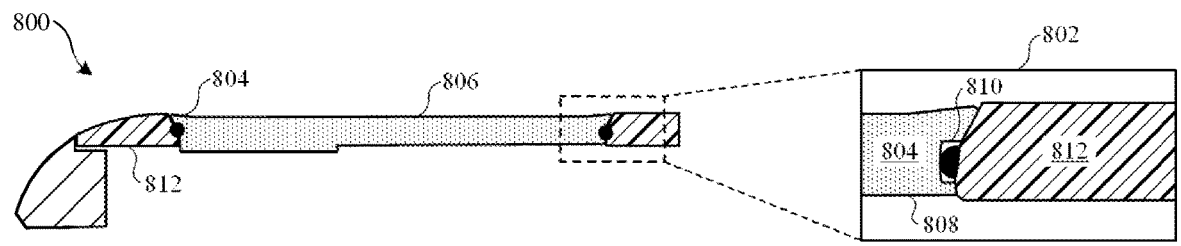
FIGS. 8A-8E show cross-section views of sensor assembly sealing configurations, in accordance with some embodiments.

FIGS. 8A-8E show cross-section views of sensor assembly sealing configurations, in accordance with some embodiments. FIG. 8A shows sensor assembly 806 positioned within an opening of enclosure portion 812 of electronic device 800. For simplicity, sensor assembly 806 and trim 804 are shown as a single block. Inset 802 shows a detailed view of an interface region between trim 804 and enclosure portion 812, at which seal 808 is positioned. Seal 808 prevents moisture from entering between trim 804 and enclosure portion 812. In some cases, seal 808 is in the form of an O-ring that is positioned within groove 810 at an outer perimeter of trim 804. The embodiment shown in FIG. 8A has a similar sealing configuration as that of FIG. 4A.

Figure 8B:
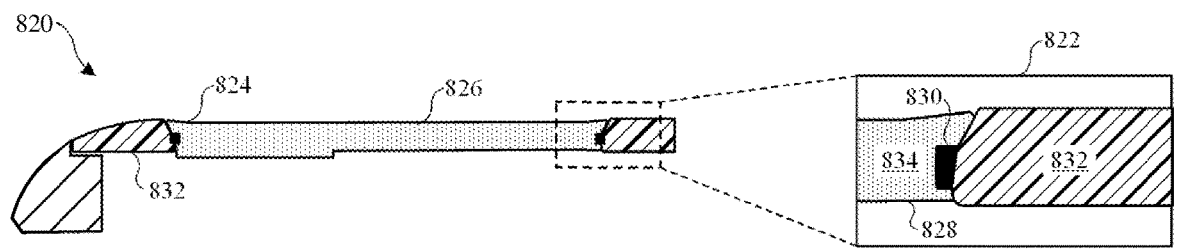

FIG. 8B shows sensor assembly 826 positioned within an opening of enclosure portion 832 of electronic device 820. For simplicity, sensor assembly 826 and trim 824 are shown as a single block. Inset 822 shows a detailed view of an interface region between trim 824 and enclosure portion 832, at which adhesive 828 is positioned Like seal 808 described above, adhesive 828 prevents moisture from entering between trim 824 and enclosure portion 832. Adhesive 828 can be composed of any suitable adhesive, including one or more of heat activated film, pressure sensitive adhesive, liquid adhesive, or other suitable adhesive material. In some embodiments, trim 834 includes groove 830 that accommodates adhesive 828.

Figure 8C:
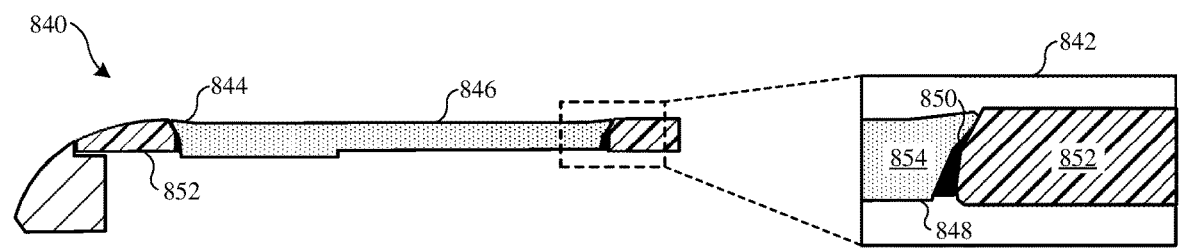

FIG. 8C shows sensor assembly 846 positioned within an opening of enclosure portion 852 of electronic device 840. For simplicity, sensor assembly 846 and trim 844 are shown as a single block. Inset 842 shows a detailed view of an interface region between trim 844 and enclosure portion 852, at which adhesive 848 is positioned. Adhesive 848 prevents moisture from entering between trim 844 and enclosure portion 852. Adhesive 848 can be composed of any suitable adhesive, including one or more of heat activated film, pressure sensitive adhesive, liquid adhesive, or other suitable adhesive material. In the embodiment of FIG. 8C, adhesive 848 is positioned within space 850 between trim 844 and enclosure portion 852. The magnitude of space 850 depends on an offset of chamfer 853 of trim 844 and chamfer 855 of enclosure portion 852. In one embodiment, chamfer 853 of trim 844 is larger than chamfer 855 of enclosure portion 852.

Figure 8D:
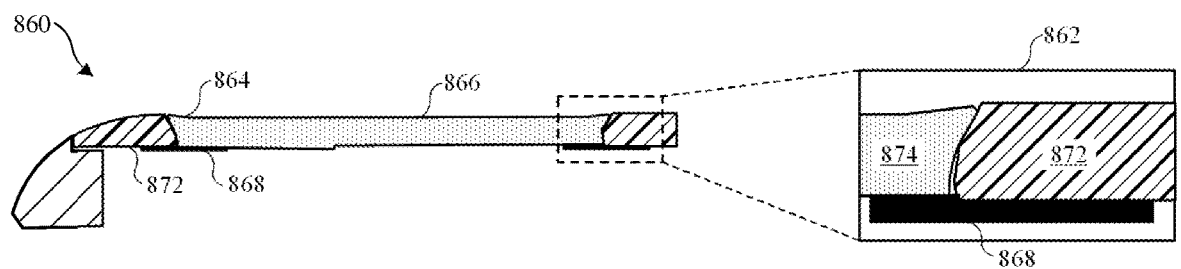

FIG. 8D shows sensor assembly 866 positioned within an opening of enclosure portion 872 of electronic device 860. For simplicity, sensor assembly 866 and trim 864 are shown as a single block. Inset 862 shows a detailed view of an interface region between trim 864 and enclosure portion 872. Gasket 868 is positioned on interior surfaces of trim 864 and enclosure portion 872, and is configured to prevent moisture from entering between trim 864 and enclosure portion 872. Gasket 868 can be composed of any suitable material, including one or more polymer materials, such as silicone. In some cases, gasket 868 is adhered to interior surfaces of trim 864 and/or enclosure portion 872 by an adhesive. In some embodiments, gasket 868 is composed of a waterproof plastic and is adhered to interior surfaces of trim 864 and enclosure portion 872 via a stack of adhesives. Since gasket 868 is accessible from the interior of the enclosure, this configuration allows gasket 868 to be assembled before or after assembling sensor assembly 866.

Figure 8E:
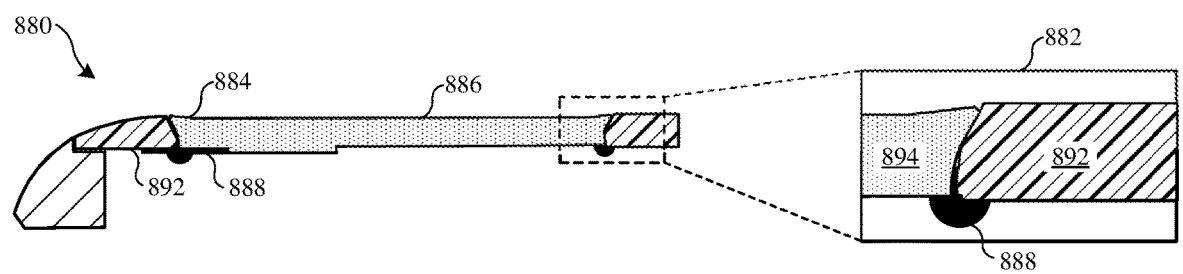

FIG. 8E shows sensor assembly 886 positioned within an opening of enclosure portion 892 of electronic device 880. For simplicity, sensor assembly 886 and trim 884 are shown as a single block. Inset 882 shows a detailed view of an interface region between trim 884 and enclosure portion 892. Potting 888 is positioned on interior surfaces of trim 884 and enclosure portion 892, and is configured to prevent moisture from entering between trim 884 and enclosure portion 892. Potting 888 can include one or more an adhesive material that is applied to interior surfaces of trim 864 and/or enclosure portion 872. Potting 888 should be applied in a sufficiently flowable state such that portions of potting 888 flows between trim 864 and/or enclosure portion 872. Once dried and hardened, potting 888 provides sufficient sealing. Potting 888 can be applied before or after assembling sensor assembly 886.

Figure 9C:
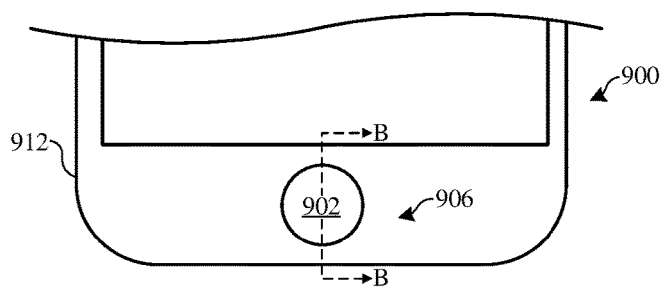
Figure 9C:
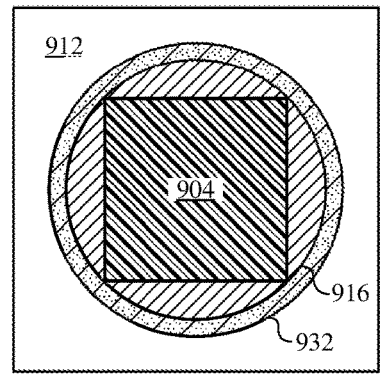
Figure 9C:
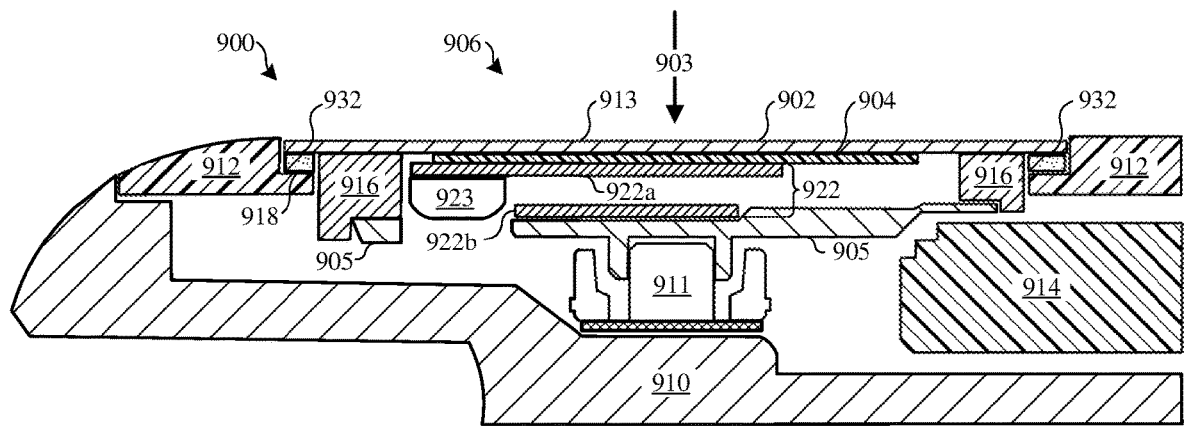

FIGS. 9A-9C show cross-section and top views of electronic device 900 having a trimless sensor assembly configuration, in accordance with some embodiments. FIGS. 9A and 9B show top views of a portion of electronic device 900 having sensor assembly 906. FIG. 9A shows sensor assembly 906 with sensor cover 902, and FIG. 9B shows sensor assembly 906 without sensor cover 202. FIG. 9C shows cross-section view at B-B of FIG. 9A.

FIG. 9A shows that sensor cover 902 is adjacent to display cover 912 without a trim between them. FIG. 9B shows that sensor component 904 is positioned beneath sensor cover 902. In some embodiments, sensor component 904 is a fingerprint sensor or touch sensor. Surrounding sensor component 904 is mounting ring 916, which, in turn, is surrounded by compressible gasket 932.

FIG. 9C shows that sensor cover 902 is adjacent display cover 912 without a trim, and that display cover 912 is coupled to enclosure portion 910. Mounting ring 916 supports sensor cover 902 and is positioned between sensor cover 902 and stiffener 905. Sensor assembly 906 is coupled to display cover 912 by fastener 911. In some embodiments, mounting ring 916 is composed of a conductive material (e.g., metal) that capacitively senses the presence of a finger at exterior surface 913 of sensor cover 902. That is mounting ring 916 is configured to capacitively detect the presence of a finger through sensor cover 902.

Compressible gasket 932 is positioned between sensor cover 902 and ledge 918 of display cover 912. Compressible gasket 932 can be made of any suitable compressible material, including one or more polymers or adhesives. In some embodiments, compressible gasket 932 is composed of layers of compressible materials. Compressible gasket 932 can be in the form of a single piece or have multiple pieces. In some cases, compressible gasket 932 has a round ring shape that corresponds to a round shape of sensor cover 902. When a user touches exterior surface 913 of sensor cover 902, the thickness of compressible gasket 932 reduces in the sensing direction 903. The force is transferred to first capacitive layer 922$a$, thereby reducing a distance between first capacitive layer 922$a$ and second capacitive layer 922$b$. This, in turn, causes a change in voltage or capacitance of touch sensor 922. Touch sensor 922 then generates a signal that activates one or more electrical circuits of electronic device 900. Compressible gasket 932 is composed of a compliant material that provides a resistive force (opposite sensing direction 903) that returns sensor cover 902 back to its un-pressed position. Once sensor cover 902 is back in its un-pressed position, compressible gasket 932 returns to its full thickness.

Figure 10A:
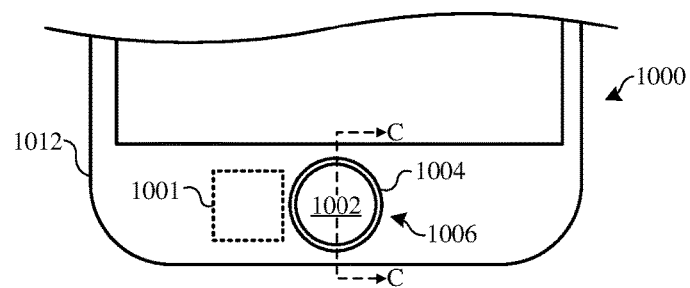
FIGS. 10A-10D show cross-section and top views of a vibrating sensor assembly configuration, in accordance with some embodiments.
Figure 10B:
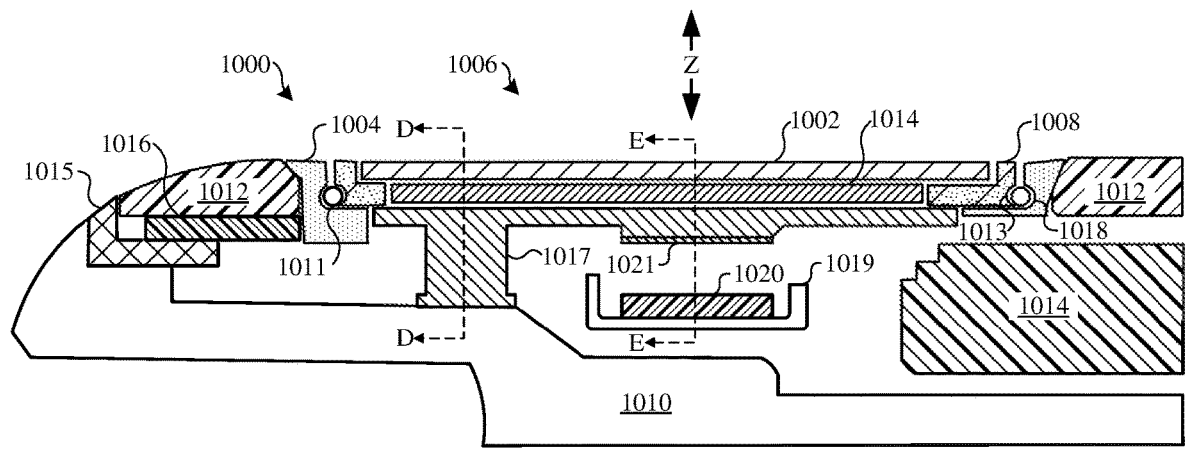
Figure 10C:
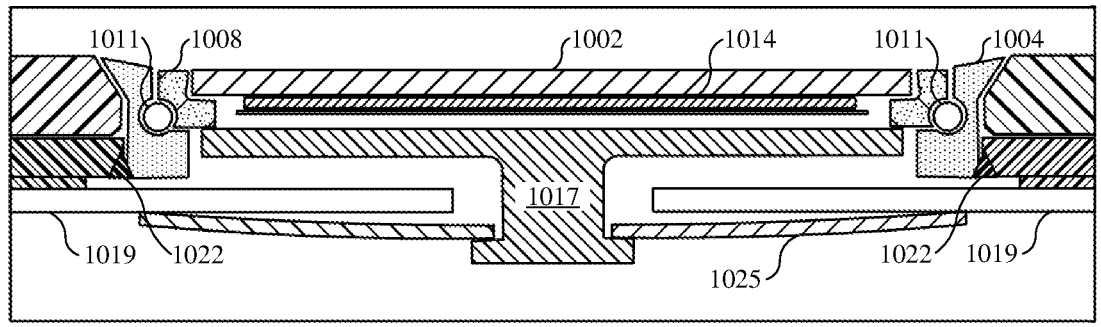
Figure 10D:
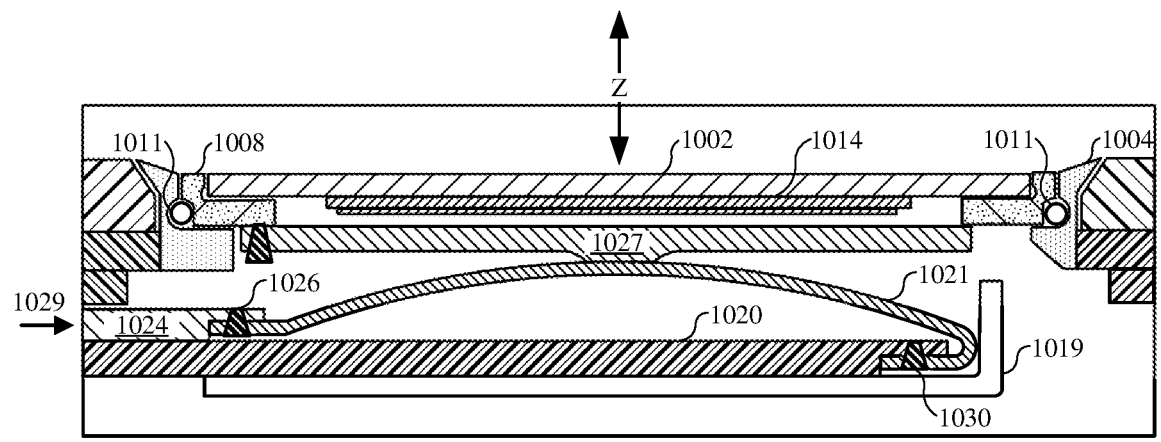

FIGS. 10A-10D show cross-section and top views of sensor assembly 1006 that is configured to vibrate, in accordance with some embodiments. FIG. 10A shows a top view of a portion of electronic device 1000 having sensor assembly 1006. FIG. 10B shows cross-section view at C-C of FIG. 10A. FIG. 10C shows cross-section view D-D of FIG. 10B. FIG. 10D shows cross section view E-E of FIG. 10B.

FIG. 10A shows piezoelectric actuator 1001 is located adjacent to sensor assembly 1006. Piezoelectric actuator 1001 is configured to vibrate sensor assembly 1006 in response to a user touching sensor cover 1002. FIG. 10B shows that the perimeter of sensor cover 1002 is surrounded by movable trim 1008, which is, in turn, surrounded by stationary trim 1004. Movable trim 1008 can be composed of a compressible and compliant material, such as a compliant polymer (e.g., silicone). Stationary trim 1004 can be made of a relatively rigid material, such as metal. In some embodiments, stationary trim 1004 corresponds to a metal ring. In some cases, stationary trim 1004 has a chamfered edge that engages with a chamfered edge of display cover 1012.

Seal 1011 is positioned between movable trim 1008 and stationary trim 1004, and is configured to prevent entry of water or other liquid between movable trim 1008 and stationary trim 1004. In some embodiments, seal 1011 is composed of a compressible material, such as a flexible polymer. The shape and size of seal 1011 will be in accordance with space limitations within sensor assembly 1006. In some embodiments, seal 1011 has an O-ring shape. In some embodiments, movable trim 1008 has groove 1013 and stationary trim 1004 has groove 1018, which accommodate seal 1011. Sensor component 1014 can correspond to a portion of one or more sensors, such as a fingerprint sensor that detects features of a user's fingerprint and/or a touch sensor that detects a user's touch.

Display cover 1012 is supported by cover frame 1015, which is, in turn, coupled to enclosure portion 1010. In some embodiments, cover frame 1015 is composed of a reinforced glass fiber material, such as a glass-fiber reinforced with polyamide. Flange 1016 is positioned between display cover 1012 and cover frame 1015 and provides extra support for display cover 1012. In some embodiments, flange 1016 is composed of a rigid metal, such a stainless steel. Retaining post 1017 is positioned below sensor component 1014. Bracket 1019 supports stationary actuator beam 1020, which is coupled to piezoelectric actuator 1001. When sensor component 1014 detects a touch from a user, sensor component 1014 generates a signal that activates piezoelectric actuator 1001. Piezoelectric actuator 1001 then causes portions of sensor assembly 1006 to move up and down (i.e., vibrate) along plane Z. For example, piezoelectric actuator 1001 can be configured to move sensor assembly 1006 such that a user feels sensor cover 1002 vibrate in response to the input. That is, sensor assembly 1006 can provide tactile feedback (output) that the user can feel, and that signals to the user that sensor assembly 1006 has been activated.

The cross-section view of FIG. 10C shows retaining post 1017 can be secured to bracket 1019 by retaining clip 1025. Bracket 1019 is coupled to stationary trim 1004 via welds 1022. Retaining post 1017 is coupled to and supports movable trim 1008. The cross-section view of FIG. 10D shows that stationary actuator beam 1020 is held stationary by bracket 1019. Flexure dome 1021, which can be composed of resilient but stiff material (e.g., metal), is coupled one end to connector 1024 via weld 1026 and on another end to stationary actuator beam 1020 via weld 1030. Connector 1024 is coupled to piezoelectric actuator 1001 (not shown). When sensor component 1014 detects an input, sensor component 1014 generates a signal that activates piezoelectric actuator 1001. In response, piezoelectric actuator 1001 pushes connector 1024 in a push direction 1029. Connector 1024 slides along stationary actuator beam 1020 and causes flexure dome 1021 to flex and push up on and release stiffener 1027. Stiffener 1027 then causes movable trim 1008 compress and decompress, thereby causing sensor cover 1002 to move up and down (i.e., vibrate) along plane Z.

Figure 11A:
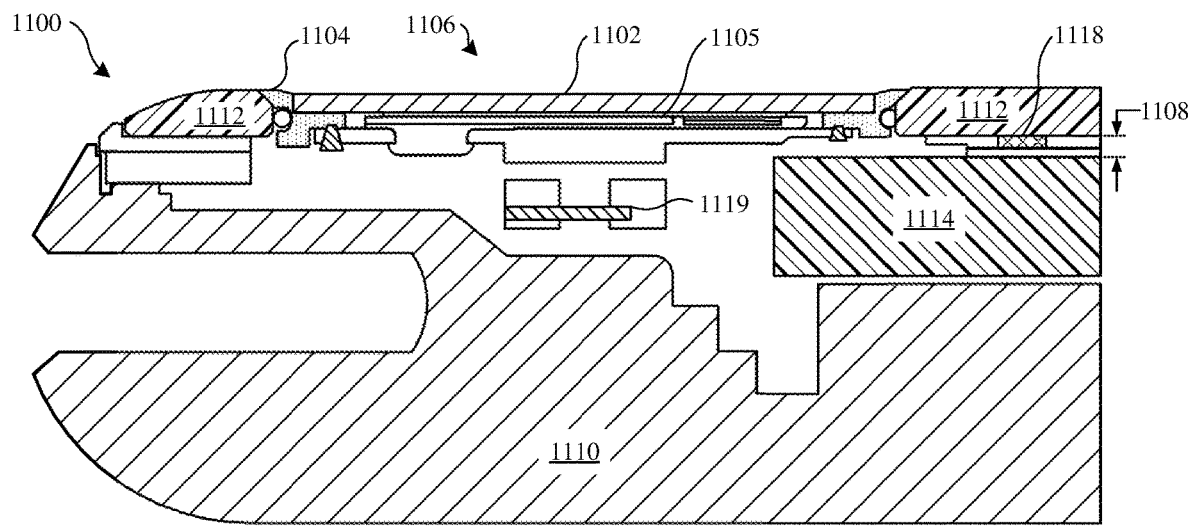
FIGS. 11A-11C show cross-section views of sensor assemblies having different sensing configurations, in accordance with some embodiments.
Figure 11B:
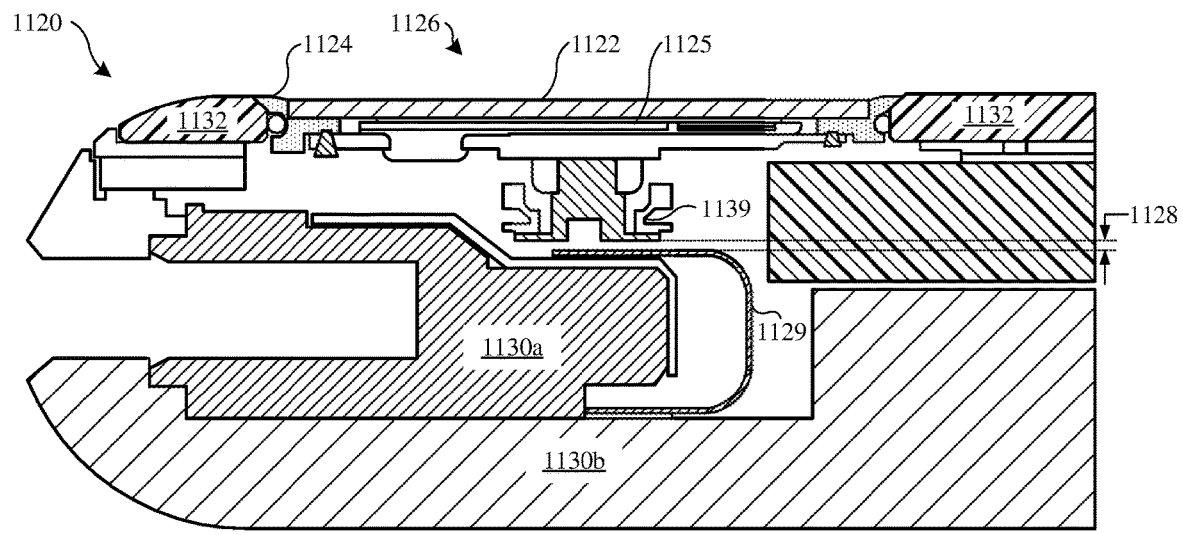
Figure 11C:
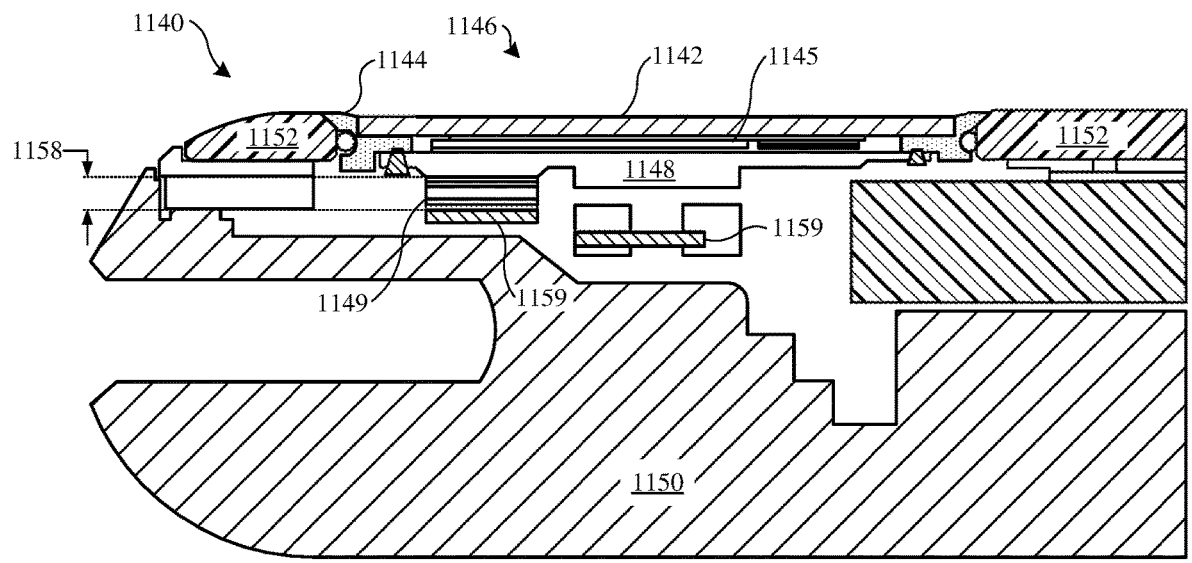

FIGS. 11A-11C show cross-section views of sensor assemblies having different sensing configurations, in accordance with some embodiments. The embodiments in FIGS. 11A-11C include architectures that allow for detection of a force input in a less localized bases (i.e., not just directly underneath a sensor cover).

FIG. 11A shows electronic device 1100, which includes sensor assembly 1106. Sensor assembly 1106 includes sensor cover 1102, which is surrounded by trim 1104 and positioned with an opening within display cover 1112. Display cover 1112 is coupled to enclosure portion 1110. Bracket 1119 secures sensor assembly 1106 to enclosure portion 1110. Fingerprint sensor 1105 is configured to recognize fingerprint features of a user through sensor cover 1102. Sensor assembly 1106 has an active area-based force-sensing configuration. In particular, when a user touches or presses on sensor cover 1112, the force will deflect display cover 1112, thereby reducing distance 1108 between display cover 1112 and component 1114. This activates force sensor 1118 (e.g., a flex capacitive sensor) that is positioned between display cover 1112 and component 1114. This configuration allows for sensing in an area around sensor cover 1102.

FIG. 11B shows electronic device 1120, which includes sensor assembly 1126. Sensor assembly 1126 includes sensor cover 1122, which is surrounded by trim 1124 and positioned with an opening within display cover 1132. Display cover 1132 is coupled to enclosure portion 1130 (which includes enclosure sections 1130a and 1130b). Bracket 1139 secures sensor assembly 1126 to enclosure sections 1130a and 1130b. Fingerprint sensor 1125 is configured to recognize fingerprint features of a user through sensor cover 1122. Sensor assembly 1126 has a display cover-to-enclosure sensing configuration. In particular, when a user touches or presses on sensor cover 1122, the force will deflect display cover 1132, thereby reducing distance 1128 between bracket 1139 and enclosure section 1130a. This activates force sensor 1129 (e.g., a flex capacitive sensor) that is positioned between bracket 1139 and enclosure section 1130a.

FIG. 11C shows electronic device 1140, which includes sensor assembly 1146. Sensor assembly 1146 includes sensor cover 1142, which is surrounded by trim 1144 and positioned with an opening within display cover 1152. Display cover 1152 is coupled to enclosure portion 1150. Bracket 1159 secures sensor assembly 1146 to enclosure portion 1150. Fingerprint sensor 1145 is configured to recognize fingerprint features of a user through sensor cover 1142. Sensor assembly 1146 has an external module-based force-sensing configuration. In particular, when a user touches or presses on sensor cover 1142, the force will deflect display cover 1132, thereby reducing distance 1158 between sensory assembly 1146 and bracket 1159. In some embodiments, distance 1158 is between stiffener 1148 of sensor assembly 1146 and bracket 1159. This activates force sensor 1149 (e.g., a flex a capacitive sensor) that is positioned between sensory assembly 1146 and bracket 1159.

Figure 11D:
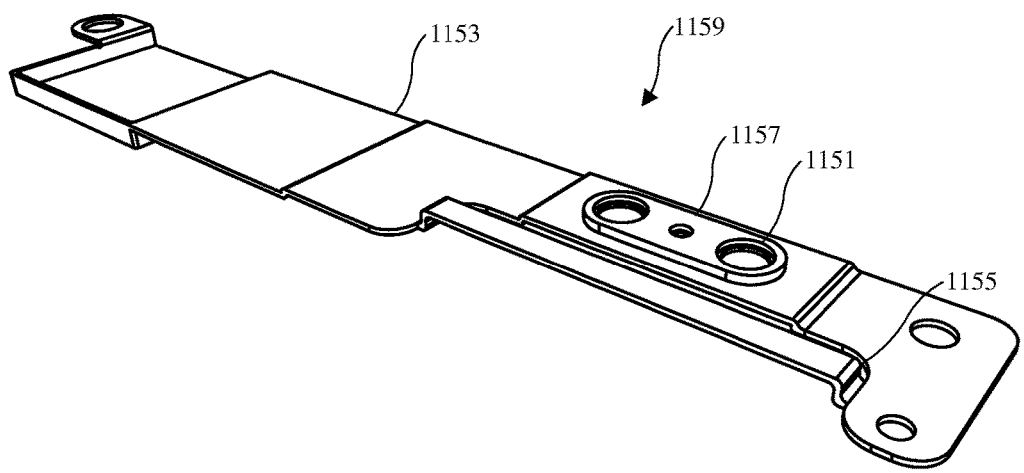
FIG. 11D shows a perspective view of a bracket as part of sensor assembly configuration of FIG. 11C, in accordance with some embodiments.

FIG. 11D shows a perspective view of bracket 1159, which is incorporated within the sensor assembly 1146 configuration of FIG. 11C, in accordance with some embodiments. Bracket 1159 includes relief cut 1155, which can improve signal from small relative deflections of display cover 1152. In some embodiments, bracket 1159 can include conductive portion 1153 (e.g., composed of metal) and non-conductive portion 1157 (e.g., plastic), which electrically isolates the conductive portion 1153. As shown, non-conductive portion 1157 can include openings 1151 for fasteners (not shown). Bracket 1159 is shown as a single piece. However, in other embodiments, a bracket having multiple pieces is used.

Figure 12A:
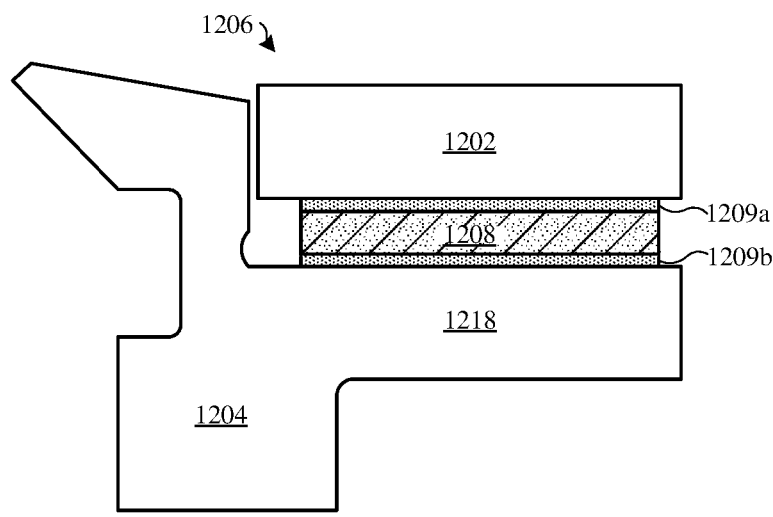
FIGS. 12A and 12B show cross-section views of a portion of an electronic device with a sensor assembly before and during a bonding operation, respectively.
Figure 12B:
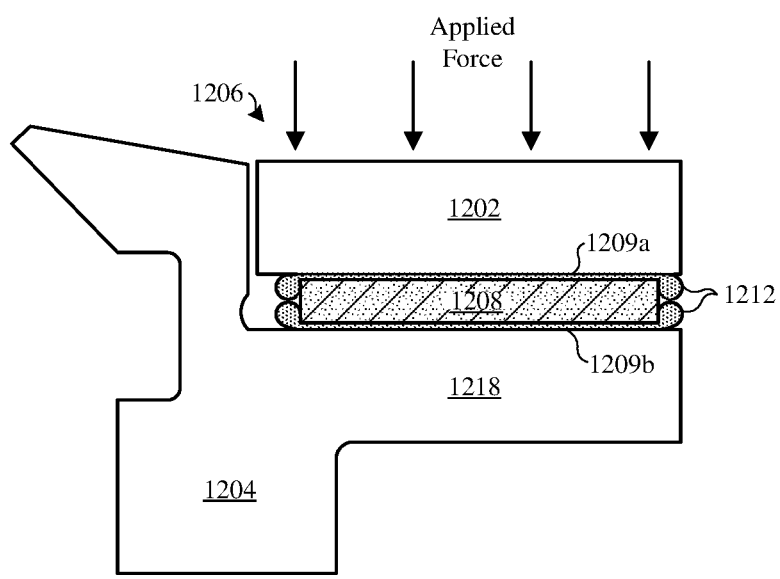

FIGS. 12A and 12B show cross-section views of a portion of an electronic device with sensor assembly 1206 before and during a bonding operation, respectively, in accordance with some embodiments. FIG. 12A shows sensor assembly 1206 prior to a bonding operation, where compliant member 1208 is positioned between sensor cover 1202 and trim 1204. In some embodiments, compliant member 1208 includes one or more layers of compliant or resilient material, such a silicone or other polymer. As described above with compliant member 302 in FIG. 3, compliant member 1208 can be one piece or include separate pieces (e.g., four circle segment-shaped pieces to accommodate a rectangular-shaped sensor component). It should be noted, however, that compliant member 1208 can have any suitable shape and include any suitable number of pieces. Adhesive layer 1209a is applied between compliant member 1208 and sensor cover 1202, and adhesive layer 1209b is applied between compliant member 1208 and ledge 1218 of trim 1204, in order to secure compliant member 1208 to sensor cover 1202 and trim 1204. Adhesive layers 1209a and 1209b can include any one or more suitable adhesive materials, such as layers of heat-activated film, pressure-sensitive adhesive, liquid adhesive, or other suitable adhesive material.

FIG. 12B shows sensor assembly 1206 during a bonding operation, where a force is applied to sensor cover 1202 toward ledge 1218 of trim 1204. As shown, if adhesive layers 1209a and 1209b are in liquid or semi-liquid form, adhesive layers 1209a and 1209b can cause overflow 1212 to form around the sides of compliant member 1208. After adhesive layers 1209a and 1209b dry and harden, overflow 1212 can be stiffer than the material of compliant member 1208, which may reduce the compliance of compliant member 1208.

Figure 13A:
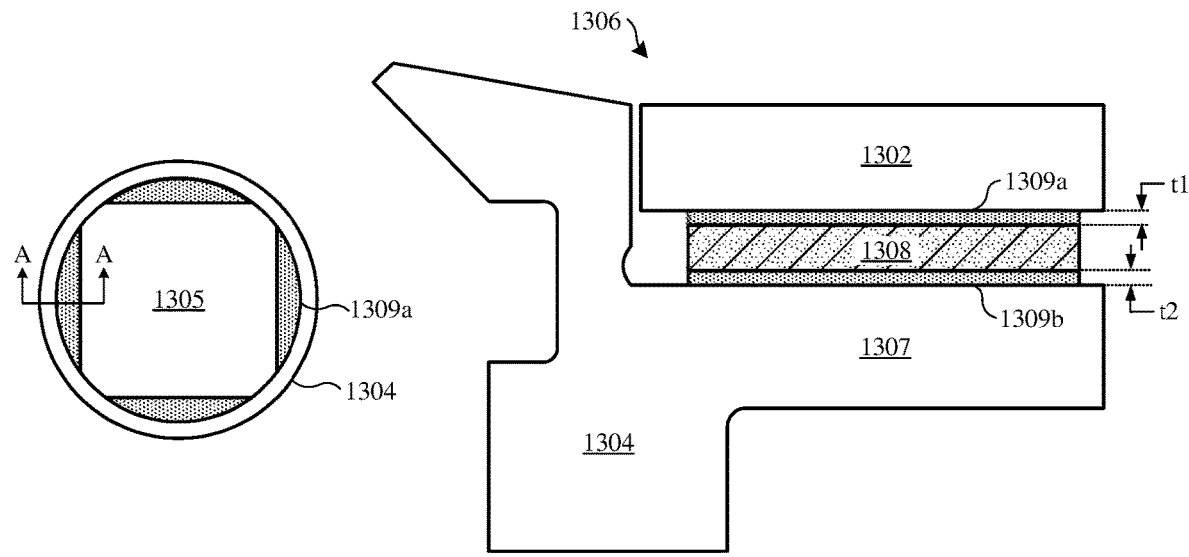
FIGS. 13A-13F show sensor assembly configurations for preventing adhesive overflow from occurring during a bonding operation, in accordance with some embodiments.

FIGS. 13A-13F show sensor assembly configurations for preventing adhesive overflow 1212 from occurring. FIG. 13A shows a top view and a cross-section A-A view of a portion of an electronic device having sensor assembly 1306. The top view shows sensor assembly 1306 without sensor cover 1302, thereby exposing sensor component 1305 (e.g., fingerprint sensor). The cross-section A-A view shows that compliant member 1308 is positioned between sensor cover 1302 and ledge 1307 of trim 1304. The thickness t1 of adhesive layer 1309a and thickness t2 of adhesive layer 1309b are each thin enough to eliminate or reduce the occurrence of overflow, yet are thick enough to adhere compliant member 1308 to sensor cover 1302 and trim 1304. In some embodiments, the total thickness (t1+t2) of adhesive layers 1309a and 1309b is about 20 micrometers.

Figure 13B:
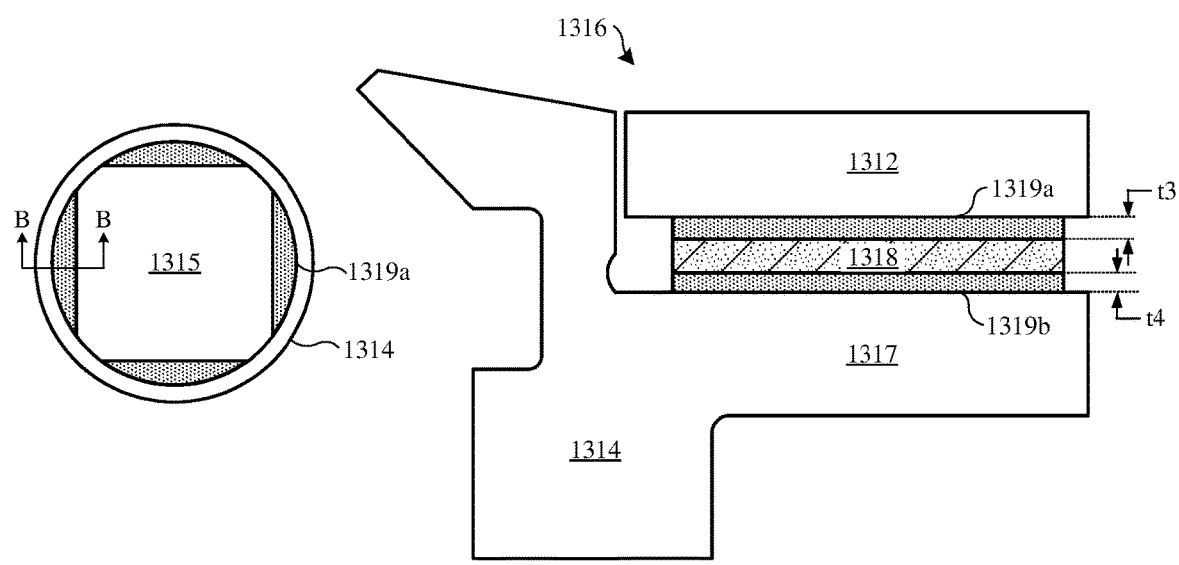

FIG. 13B shows a top view and a cross-section B-B view of a portion of an electronic device having sensor assembly 1316. The top view shows sensor assembly 1316 without sensor cover 1312, thereby exposing sensor component 1315 (e.g., fingerprint sensor). The cross-section B-B view shows compliant member 1318 positioned between sensor cover 1312 and ledge 1307 of trim 1314. In this embodiment, the total thickness (t3+t4) of adhesive layers 1319a and 1319b, respectively, is larger than the total thickness (t1+t2) of adhesive layers 1309a and 1309b described above with reference to FIG. 13A. This greater amount of adhesive material can increase the bond strength of compliant member 1318 to sensor cover 1302 and trim 1304 compared to thinner adhesive layers. In some embodiments, the total thickness (t3+t4) is about 20 micrometers. In some cases, however, these larger thicknesses t3 and t4 can increase the risk of overflow around the edges of compliant member 1318, such as described above with reference to FIG. 2B.

Figure 13C:
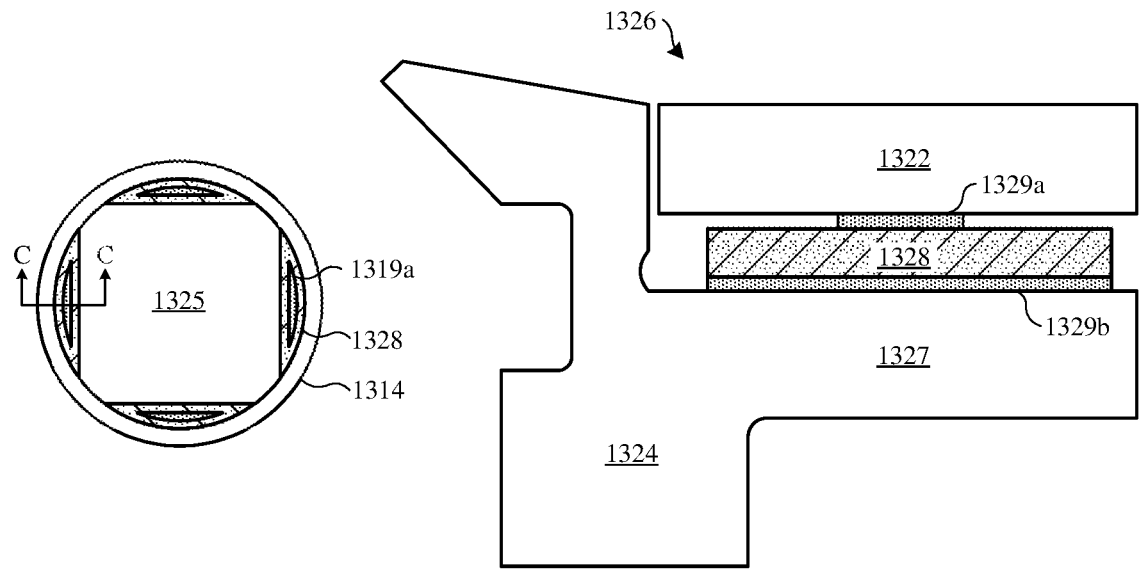

FIG. 13C shows a top view and a cross-section C-C view of a portion of an electronic device having sensor assembly 1326. The top view shows sensor assembly 1326 without sensor cover 1322, thereby exposing sensor component 1325 (e.g., fingerprint sensor). The cross-section C-C view shows compliant member 1328 positioned between sensor cover 1322 and ledge 1327 of trim 1324. Prior to applying a force during a bonding operation (e.g., see FIG. 2B), adhesive layer 1329a covers less surface area of compliant member 1328 and has lesser volume of adhesive material than adhesive layer 1329b. This configuration can eliminate or reduce the amount of overflow at the top edges of compliant member 1328. In particular, when a force is applied during a bonding operation, both adhesive layers 1329a and 1329b will spread toward the edges of compliant member 1328. Since adhesive layer 1329a has a lesser volume, adhesive layer 1329a will not overflow or will overflow very little. This configuration can be useful in embodiments where less adhesive material is needed to adequately adhere compliant member 1328 to sensor cover 1322 compare to an amount of adhesive material needed to adequately adhere compliant member 1328 to trim 1324.

Figure 13D:
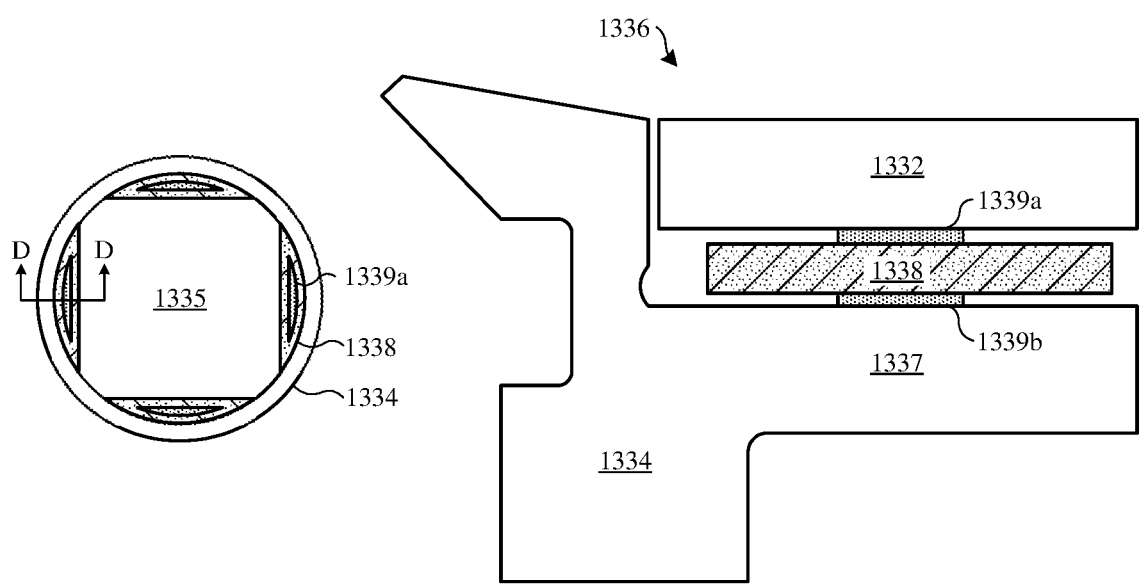

FIG. 13D shows a top view and a cross-section D-D view of a portion of an electronic device having sensor assembly 1336. The top view shows sensor assembly without sensor cover 1332, thereby exposing sensor component 1335 (e.g., fingerprint sensor). The cross-section D-D view shows compliant member 1338 positioned between sensor cover 1332 and ledge 1337 of trim 1334. In this embodiment, both adhesive layers 1339a and 1339b cover less surface area of compliant member 1338 and have lesser volume of adhesive than the embodiment of FIG. 3A or FIG. 3B. This configuration can eliminate or reduce the amount of overflow at the top and bottom edges of compliant member 1338 once a force is applied during a bonding operation (see FIG. 2B). Care should be taken, however, to assure that adhesive layers 1339a and 1339b have enough volume to adequately bond compliant member 1338 with sensor cover 1332 and trim 1334. In some cases, this may mean increasing tolerances during the manufacturing process.

Figure 13E:
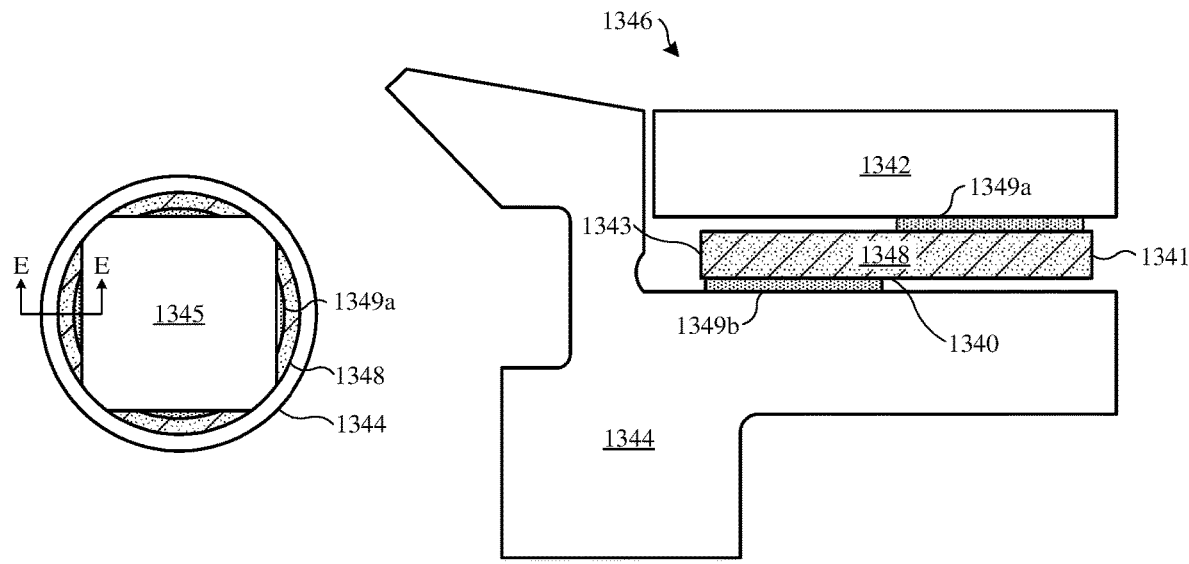

FIG. 13E shows a top view and a cross-section E-E view of a portion of an electronic device having sensor assembly 1346. The top view shows sensor assembly 1346 without sensor cover 1342, thereby exposing sensor component 1345 (e.g., fingerprint sensor). The cross-section E-E view shows compliant member 1348 positioned between sensor cover 1342 and ledge 1347 of trim 1344. In this embodiment, adhesive layers 1349a and 1349b are in a staggered configuration. In particular, adhesive layer 1349a is positioned closer to first end 1341 of compliant member 1348, and adhesive layer 1349b is positioned closer to second end 1343 of compliant member 1348. In some cases, adhesive layers 1349a and 1349b do not over lap at middle portion 1340 of compliant member 1348. When a force is applied during a bonding operation, any overflow will be directed to opposing ends of compliant member 1348 (i.e., first end 1341 and second end 1343). This prevents joining of any of the overflow of adhesive layers 1349a and 1349b at the edges of compliant member 1348. Note that care should be taken to assure that the load applied during the bonding operation is even despite the staggered adhesive layer configuration.

Figure 13F:
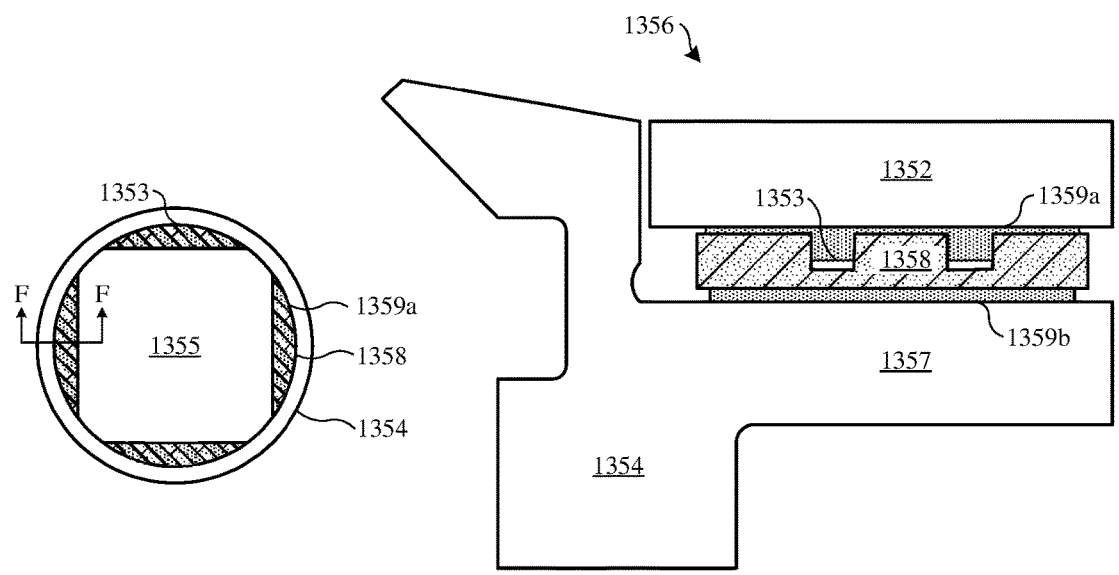

FIG. 13F shows a top view and a cross-section F-F view of a portion of an electronic device having sensor assembly 1356. The top view shows sensor assembly 1356 without sensor cover 1352, thereby exposing sensor component 1355 (e.g., fingerprint sensor). The cross-section F-F view shows compliant member 1358 positioned between sensor cover 1352 and ledge 1357 of trim 1354. In this embodiment, compliant member 1358 includes recesses 1353, which correspond to channels that provide space for adhesive layer 1259a to flow into during the bonding operation (e.g., as shown in FIG. 12B), thereby preventing overflow of adhesive material around the outer edges of compliant member 1358. Furthermore, this configuration can enhance an even distribution of adhesive layer 1259a at the surface of compliant member 1358. Recesses 1353 can have any suitable shape and are not limited to the elongated channel shapes shown in FIG. 13F. For example, the recesses can be circular, triangular, rectangular, and/or chevron shaped. In some embodiments, recesses are on an opposing side of compliant member 1358 in order to accommodate adhesive layer 1259b. In some embodiments, two sides of compliant member 1358 include recesses in order to accommodate adhesive layer 1259a and adhesive layer 1259b.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device, comprising:
   a housing comprising a wall, the housing defining a first opening, a second opening, and an internal volume;
   a processor carried by the housing;
   a speaker disposed at least partially within the internal volume and positioned to direct sound through the first opening;
   a sensor assembly positioned within the second opening and in communication with the processor, the sensor assembly comprising:
      a sensor cover defining an accessible and movable outer surface; and
      a light detecting sensor capable of detecting a first movement of the outer surface and providing a first signal in response to the first movement, the first movement exceeding a first distance of about 4 micrometers, the light detecting sensor further capable of detecting a second movement of the outer surface and providing a second signal in response to the second movement, the second movement exceeding a second distance of about 4 micrometers, the second movement being in a different direction than the first movement; and
   an acoustic component in communication with the light detecting sensor and capable of providing a first sound based on the first movement, and a second sound based on the second movement;
   wherein the first sound mimics a mechanical component.

2. The electronic device of claim 1, wherein the first sound mimics a first mechanical component, and the second sound mimics a second mechanical component.

3. The electronic device of claim 2, wherein the acoustic component produces a clicking sound in response to the first movement.

4. The electronic device of claim 1, wherein the wall is a side wall of the housing.

5. The electronic device of claim 1, wherein the accessible and movable outer surface is offset from an exterior surface defined by the wall.

6. The electronic device of claim 1, wherein the light detecting sensor is capable of detecting a push input on the sensor cover.

7. The electronic device of claim 1, wherein the light detecting sensor is capable of detecting a motion of the sensor cover.

8. The electronic device of claim 1, wherein the sensor assembly comprises a pre-assembled module.

9. The electronic device of claim 1, wherein the speaker is positioned proximate to the sensor assembly.

10. A portable electronic device, comprising:
    a housing carrying a speaker and defining an opening;
    a processor carried by the housing;
    a sensor assembly carried by the housing and in communication with the processor, the sensor assembly having a solid-state sensor and a sensor cover, the sensor assembly disposed within the opening, wherein:
       a first movement of the sensor cover in a first direction, in accordance with a first input applied by a user, is detectable by the solid-state sensor;
       a second movement of the sensor cover in a second direction different than the first direction, in accordance with a second input applied by a user, is detectable by the solid-state sensor; and
       the sensor assembly is configured to provide a first signal to the processor corresponding to a detection of the first movement exceeding a first distance of about 4 micrometers and a second signal to the processor corresponding to a detection distance of the second movement exceeding a second distance of about 4 micrometers; and
    an acoustic component in communication with the processor, the acoustic component capable of providing, based on the first signal indicative of the first movement exceeding the first distance, an acoustic feedback.

11. The portable electronic device of claim 10, wherein the housing comprises metal.

12. The portable electronic device of claim 10, wherein the speaker is a first speaker and the housing carries a second speaker.

13. The portable electronic device of claim 10, wherein the housing is non-transparent.

14. The portable electronic device of claim 10, wherein the solid-state sensor is capable of detecting a push input on the sensor cover.

15. A wearable electronic device, comprising:
    a housing comprising a side wall at least partially defining a housing opening and a side wall opening;
    a processor carried by the housing;

a speaker carrier by the housing and positioned to direct sound through the housing opening;

a pre-assembled sensor assembly carried by the housing in the side wall opening and in communication with the processor, the sensor assembly comprising:

a sensor cover disposed within the side wall opening and having an accessible and movable outer surface; and a capacitive sensor capable of detecting a first movement and a second movement of the outer surface and providing a first signal and a second signal in response to the first movement or the second movement, respectively, the first movement being in a first direction and the second movement being in a second direction different than the first direction; and an acoustic component in communication with the processor and capable of providing an acoustic feedback in response to a command from the processor based on the first signal.

16. The wearable electronic device of claim 15, wherein the acoustic component is capable of producing a clicking sound.

17. The wearable electronic device of claim 15, wherein the capacitive sensor is capable of detecting a motion of the sensor cover.

18. The wearable electronic device of claim 15, wherein the acoustic component is proximate to the sensor assembly.

* * * * *